(12) United States Patent
Lim et al.

(10) Patent No.: US 12,050,251 B2
(45) Date of Patent: Jul. 30, 2024

(54) METHOD FOR ESTIMATING STATE OF HEALTH OF BATTERY

(71) Applicant: Samsung SDI Co., Ltd., Yongin-si (KR)

(72) Inventors: Byeonghui Lim, Yongin-si (KR); Yongjun Hwang, Yongin-si (KR); Christober Rayappan, Yongin-si (KR); Giheon Kim, Yongin-si (KR); Jake Kim, Yongin-si (KR); Sungwook Paek, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 288 days.

(21) Appl. No.: 17/310,954

(22) PCT Filed: Nov. 28, 2019

(86) PCT No.: PCT/KR2019/016610
§ 371 (c)(1),
(2) Date: Sep. 1, 2021

(87) PCT Pub. No.: WO2020/184812
PCT Pub. Date: Sep. 17, 2020

(65) Prior Publication Data
US 2022/0082626 A1 Mar. 17, 2022

(30) Foreign Application Priority Data

Mar. 12, 2019 (KR) .................. 10-2019-0028155

(51) Int. Cl.
*G01R 31/36* (2020.01)
*G01R 31/367* (2019.01)
(Continued)

(52) U.S. Cl.
CPC ....... *G01R 31/3648* (2013.01); *G01R 31/367* (2019.01); *G01R 31/3842* (2019.01); *G01R 31/392* (2019.01)

(58) Field of Classification Search
CPC .............. G01R 31/3648; G01R 31/367; G01R 31/3842; G01R 31/392; G01R 31/382;
(Continued)

(56) References Cited

U.S. PATENT DOCUMENTS 8,046,181 B2 10/2011 Kang et al.
9,658,291 B1* 5/2017 Wang ................. G01R 31/3842
(Continued)

FOREIGN PATENT DOCUMENTS

CN 102119338 A 7/2011
CN 105334465 A 2/2016
(Continued)

OTHER PUBLICATIONS

European Search Report for EP 19918598.4 dated Nov. 21, 2022, 8 pages.
(Continued)

*Primary Examiner* — Jeffrey P Aiello
(74) *Attorney, Agent, or Firm* — Lewis Roca Rothgerber Christie LLP

(57) ABSTRACT

Provided is a method of estimating the state of health of the battery according to various embodiments. The method of estimating the state of health of the battery comprises: measuring a voltage and current of a battery in use to periodically generate a voltage value and a current value; using an adaptive filter to periodically update a G parameter value and an H parameter value in real time from the voltage value and the current value, said parameters indicating the present state of the battery; and using an initial value and a final value of the G parameter that is preset and a present
(Continued)

value of the G parameter to estimate the state of health of the battery in real time. The G parameter is a parameter that represents the sensitivity of the voltage to changes in the current of the battery, and the H parameter is a parameter that represents an effective potential determined by the local equilibrium potential distribution and resistance distribution inside the battery.

17 Claims, 8 Drawing Sheets

(51) Int. Cl.
*G01R 31/3842* (2019.01)
*G01R 31/392* (2019.01)

(58) Field of Classification Search
CPC .. G01R 31/396; G01R 31/389; G01R 31/374; G01R 31/006; G01R 31/40; G01R 31/36; G01R 21/133; G01R 19/16542; B60L 2240/547; B60L 2240/549; B60L 58/12; B60L 58/16; Y02T 90/16; Y02T 90/14; Y02T 10/70; Y02T 10/7072; Y02T 10/62; Y02T 10/72; G06F 17/18
USPC ....... 320/132, 134, 136, 116, 162, 137, 150, 320/107, 130, 104, 127; 324/426, 72, 324/76.11; 702/63, 182, 188, 183, 189, 702/190, 64, 79, 127, 1, 108, 35, 176; 703/2, 12
See application file for complete search history.

(56) References Cited

U.S. PATENT DOCUMENTS

| | | | |
|---|---|---|---|
| 11,035,906 B2 | 6/2021 | Laurent et al. | |
| 11,366,171 B2 | 6/2022 | Lim et al. | |
| 2003/0184307 A1* | 10/2003 | Kozlowski | H01M 10/48 |
| | | | 324/427 |
| 2014/0244225 A1* | 8/2014 | Balasingam | G01R 31/3835 |
| | | | 703/2 |
| 2015/0066406 A1* | 3/2015 | Sun | G01R 31/392 |
| | | | 702/63 |
| 2017/0242077 A1 | 8/2017 | Guo et al. | |
| 2018/0017628 A1* | 1/2018 | Takegami | H01M 10/44 |
| 2018/0111599 A1* | 4/2018 | Wang | B60W 20/13 |
| 2018/0143257 A1 | 5/2018 | Garcia et al. | |
| 2019/0187212 A1* | 6/2019 | Garcia | G01R 31/382 |

FOREIGN PATENT DOCUMENTS

| | | |
|---|---|---|
| CN | 106054080 A | 10/2016 |
| CN | 108896926 A | 11/2018 |
| CN | 109061508 A | 12/2018 |
| CN | 109154635 A | 1/2019 |
| JP | 2006-058114 A | 3/2006 |
| JP | 2011-122951 A | 6/2011 |
| JP | 2012-063251 A | 3/2012 |
| JP | 2018-096953 A | 6/2018 |
| JP | 7095110 B2 | 6/2022 |
| KR | 10-2013-0126231 A | 11/2013 |
| KR | 10-1835375 B1 | 3/2018 |
| KR | 10-1835376 B1 | 3/2018 |
| KR | 10-2018-0115817 A | 10/2018 |
| KR | 10-2019-0123172 A | 10/2019 |
| KR | 10-2021-0000206 A | 1/2021 |
| KR | 10-2021-0000207 A | 1/2021 |
| KR | 10-2022-0016685 A | 2/2022 |

OTHER PUBLICATIONS

International Search Report for PCT/KR2019/016610 dated Mar. 4, 2020, 2 pages.
Japanese Office Action for JP 2021-554778 dated Oct. 3, 2022, 6 pages.
Kim et al., "Efficient and Extensible Quasi-Explicit Modular Nonlinear Multiscale Battery Model: GH-MSMD," J. Electrochem. Soc., 164(6), 2017, pp. A1076-A1088.
Marongiu ,A. ,"Performance and Aging Diagnostic on Lithium Iron Phosphate Batteries for Electric Vehicles and Vehicle-to-Grid Strategies—From the Cell to the System Level," Battery Systems in Vehicle-to-Grid, 2017, 6 pages.
Vahidi, et al. "Recursive Least Squares with Forgetting for Online Estimation of Vehicle Mass and Road Grade: Theory and Experiments," Vehicle System Dynamics 43(1), Jan. 2005, pp. 31-55.
Chinese Notification of First Office Action, for Patent Application No. 201980093958.0, mailed Dec. 18, 2023, 15 pages, with English translation.

* cited by examiner

METHOD FOR ESTIMATING STATE OF HEALTH OF BATTERY

CROSS-REFERENCE TO RELATED APPLICATIONS

This application is a U.S. National Phase Patent Application of International Application Number PCT/KR2019/016610, filed on Nov. 28, 2019, which claims priority to Korean Patent Application Number 10-2019-0028155, filed on Mar. 12, 2019, the entire content of both of which is incorporated herein by reference.

TECHNICAL FIELD

The present invention relates to a method of estimating a state of health (SOH) of a battery in real time.

BACKGROUND ART

Batteries have high applicability compared to other energy storage devices and have been widely used in electric vehicles (EVs) or hybrid electric vehicles (HEVs) driven by electric driving sources as well as portable devices due to characteristics such as relatively high energy and power density. In particular, when a strong output is required, a battery pack, in which a plurality of batteries are connected in series and in parallel, may also be used.

Battery management is significant for energy-efficient and safe use of batteries or battery-powered electrical devices, and to this end, accurate estimation and diagnosis of the battery state is essential. Currently widely used estimated values may include a state of charge (SOC), a state of health (SOH), and a power limit estimation (PLE). As described above, the technology for estimating the state of the battery is called battery state estimation (BSE).

The state of health is also referred to as battery life, battery aging state, and battery deterioration state, and generally defined as a percentage of present capacity respective to the initial capacity of the battery. Known conventional health state estimation methods mainly include methods of estimating the state of health by calculating the capacity of an actual battery by measuring the amount of released electric charge using an electric sensor, by using a relation between open circuit voltage (OVC) and state of charge (SOC), and by tracking the resistance component or impedance parameter value of the battery. However, these conventional methods have problems of having to discontinue using the battery, having to match certain conditions or environments, or unreliable accuracy due to accumulated sensor errors or estimation errors.

DESCRIPTION OF EMBODIMENTS

Technical Problem

The object of the present disclosure is to overcome the weakness of the conventional methods to thereby provide a method of accurately estimating a battery state in real time using a voltage value and a current value obtained by measuring a voltage and current of a battery being used. The present disclosure provides a method of tracing a state of health of the battery by estimating a value of a G parameter among the G parameter and H parameter indicating the internal state of the battery. The present disclosure provides an estimation algorithm of the state of health that may be loaded to a battery management system (BMS) by tracking a value of a G parameter in real time.

Solution to Problem

A method of estimating the state of health of a battery includes: measuring a voltage and current of a battery in use to periodically generate a voltage value and a current value; using an adaptive filter to periodically update a G parameter value and an H parameter value in real time from the voltage value and the current value, said parameters indicating the present state of the battery; and using an initial value and a final value of the G parameter that is preset and a present value of the G parameter to estimate the state of health of the battery in real time. The G parameter is a parameter that represents sensitivity of the voltage to changes in the current of the battery, and the H parameter is a parameter that represents an effective potential determined by the local equilibrium potential distribution and resistance distribution inside the battery.

According to an embodiment, the state of health of the battery may be estimated based on a percentage value of the difference between the final value of the G parameter and the initial value and of the G parameter relative to the difference between the final value of the G parameter and the present value of the G parameter.

According to another example, the adaptive filter may be a filter using a recursive least squares (RLS) method.

According to another example, the method of estimating the state of health of the battery may further include initializing a state vector composed of the G parameter and the H parameter, and a covariance matrix, and setting the initial value and the final value of the G parameter.

According to another example, the periodical generating the voltage value and the current value may include: generating an immediately preceding voltage value and an immediately preceding current value; and generating a present voltage value and a present current value after a preset time period.

According to another example, the method of estimating the state of health of the battery may further include: calculating a current difference between the present current value and the immediately preceding current value; and comparing the current difference with a preset range. When the current difference is within the preset range, the G parameter value and the H parameter value may be updated using the present voltage value and the present current value. When the current difference exceeds the preset range, the G parameter value and the H parameter value may not be updated.

According to another example, the updating of the G parameter value and the H parameter value in real time may include: calculating a present voltage estimate of the battery based on the present current value and an immediately preceding value of the state vector; updating a gain matrix and the covariance matrix based on the present current value and an immediately preceding value of the covariance matrix; calculating a voltage error between the present voltage value and the present voltage estimate; and updating the state vector based on the immediately preceding value of the state vector, a present value of the gain matrix, and the voltage error so as to generate a present value of the G parameter and a present value of the H parameter.

According to another example, the present voltage estimate may be calculated as a value obtained by adding an immediately preceding value of the H parameter to a product of the present current value and the immediately preceding value of the G parameter.

According to another example, the present value of the state vector may be calculated as a value obtained by adding an immediately preceding value of the H parameter to a product of the present current value and an immediately preceding value of the G parameter.

According to another example, when the gain matrix and the covariance matrix are updated, a first forgetting factor relating to the G parameter and a second forgetting factor relating to the H parameter may be applied.

According to another example, the gain matrix may be calculated by the following equation.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

The covariance matrix may be calculated by the following equation.

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

Here, $L(t)$ is a present value of the gain matrix, $L(t-1)$ is an immediately preceding value of the gain matrix, $P(t)$ is a present value of the covariance matrix, $P(t-1)$ is an immediately preceding value of the covariance matrix, $I(t)$ is the present current value, $\lambda_1$ may be the first forgetting factor, and $\lambda_2$ may be the second forgetting factor.

According to another example, the method of estimating the state of health of the battery in real time may include: storing a state of health score of the battery calculated based on the initial value, the final value, and the present value of the G parameter; examining the state of health checking condition; and estimating a value of the state of health of the battery based on the state of health score.

According to another example, the state of health checking condition may be set based on whether the state of health score has been saved during a recent first period. The value of the state of health of the battery may be generated based on a moving average of the state of health scores of a second period.

According to another example, the method of estimating the state of health of the battery may further include: setting first to nth charge/discharge rate sections (n is a natural number) that do not overlap with each other; initializing first to nth state vectors including first to nth G parameters and first to nth H parameters, respectively, and first to nth covariance matrices; setting initial values and final values of each of the first to nth G parameters; generating an immediately preceding voltage value and an immediately preceding current value, and generating a present voltage value and a present current value after a preset time period; calculating a current difference between the present current value and the immediately preceding current value; comparing the current difference with each of the first to nth charge/discharge rate sections; calculating each of first to nth states of health scores based on initial values, final values, and present values of each of the first to nth G parameters; and estimating a value of the state of health of the battery in real time based on the first to nth states of health scores.

According to another example, when the current difference belongs to a jth section among the first to nth charge/discharge rate sections (j is a natural number less than or equal to n), the a jth G parameter value and a jth H parameter value may be updated using the present voltage value and the present current value, and a jth state of health score of the battery may be calculated using an initial value, final value, and present value of the jth G parameter.

According to another example, the jth G parameter value and the jth H parameter value may be updated in real time by: calculating a present voltage estimate of the battery based on the present current value and an immediately preceding value of a jth state vector; updating a gain matrix and a jth covariance matrix based on the present current value and an immediately preceding value of the jth covariance matrix; calculating a voltage error between the present voltage value and the present voltage estimate; and updating the jth state vector based on the immediately preceding value of the jth state vector, a present value of the gain matrix, and the voltage error.

A method of estimating a state of health of a battery includes: initializing first to third state vectors and first to third covariance matrices used in a recursive least squares filter, wherein each of the first to third state vectors include first to third G parameters and first to third H parameters; setting an initial value and a final value of the first G parameter, an initial value and a final value of the second G parameter, and an initial value and a final value of the third G parameter; as an operation of periodically measuring a voltage and current of a battery in use, generating an immediately preceding voltage value and an immediately preceding current value, and after a preset time period, generating a present voltage value and a present current value; calculating a current difference between the present current value and the immediately preceding current value; updating the first state vector and the first covariance matrix when the current difference is greater than or equal to a first threshold value and less than a second threshold value, updating the second state vector and the second covariance matrix when the current difference is greater than or equal to the second threshold value and less than a third threshold value, and updating the third state vector and the third covariance matrix when the covariance matrix is greater than or equal to the third threshold value and less than a fourth threshold value; calculating a first state of health score based on the initial value, the final value, and a present value of the first G parameter, calculating a second state of health score based on the initial value, the final value, and a present value of the second G parameter, and calculating a third state of health score based on the initial value, the final value, and a present value of the third G parameter; and estimating a state of health of the battery in real time based on the first to third states of health scores.

According to an example, the method of estimating the state of health of the battery may include examining a state of health checking condition based on whether the first to third states of health scores have been stored for a recent first period.

According to another example, the estimating the state of health of the battery in real time may include: calculating a first moving average of the first state of health scores of a second period; calculating a second moving average of the second state of health scores of the second period; calculating a third moving average of the third state of health scores of the second period; and calculating a value of the state of health of the battery based on an average of the first to third moving averages.

According to another example, the updating the kth state vector and the kth covariance matrix (k is 1, 2, or 3) may include: calculating a present voltage estimate of the battery based on the present current value and a recent value of the kth state vector; updating a gain matrix and the kth covariance matrix based on the present current value and a recent value of the kth covariance matrix; calculating a voltage error between the present voltage value and the present voltage estimate; and updating the kth state vector based on a recent value of the kth state vector, a present value of the gain matrix, and the voltage error.

According to another example, in a case where the gain matrix and the kth covariance matrix are updated, a first forgetting factor relating to the kth G parameter and a second forgetting factor relating to the kth H parameter may be applied.

Advantageous Effects of Disclosure

A method of estimating the state of health (SOH) of a battery according to various embodiments of the present disclosure is greatly improved in terms of cost, scalability, and adaptability, compared to conventional methods. Existing methods of estimating state of health based on complex battery models are complicated to be applied to the BMS or cannot obtain the state of health in real time, but the method of Ith state estimating state of health according to the present disclosure may be loaded onto the BMS in the form of an algorithm. Moreover, in the conventional methods, current/voltage operation data is limited to certain operating conditions, but because the number and range of C-rate sections of the present disclosure may be flexibly extended, the state of health may be obtained in any operating condition. In conventional methods, the accuracy of the current sensor greatly affects the accuracy of estimating the state of health, and as deterioration progresses, the error gradually accumulates, but the present invention enables real-time estimation without error accumulation by using real-time parameter values obtained using an adaptive filter. Particularly, the present disclosure may be universally used not only at the cell level, but also at the pack level or system level of the battery, and may estimate a state of health accurately by reflecting, in real time, pattern-dependent deterioration that changes according to battery usage history.

According to various embodiments of the present disclosure, by using a voltage value and a current value obtained by measuring a voltage and current of the battery in use, the state of health may be accurately estimated in real time through simple calculations. Because only the voltage and current data of the battery is used, the hardware configuration is simple, and because the calculation process of estimating the state of health of the battery is not complicated, a microprocessor being used in the BMS of the battery pack may accurately estimate the state of health of the battery in real time. In addition, because the amount of data required for calculations for estimating the state of health is not large, even with a small memory capacity, the method of estimating the state of health according to the present disclosure may be performed.

BEST MODE

Figure 1:
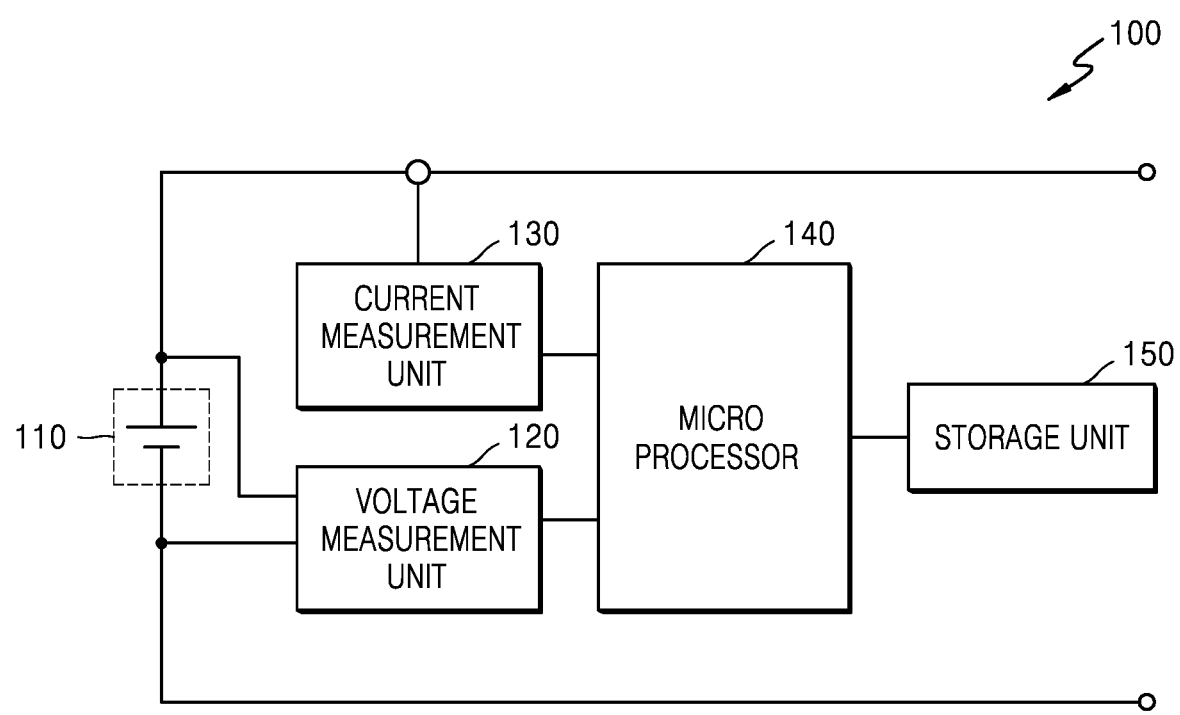
FIG. 1 is a schematic configuration view of a battery system for performing a method of estimating a state of health of a battery according to an embodiment.

Advantages and features of the present disclosure, and ways to achieve them will become apparent by referring to embodiments that will be described later in detail with reference to the drawings. However, the present disclosure is not limited to embodiments presented below but may be embodied in various different forms, and it is to be appreciated that all changes, equivalents, and substitutes that do not depart from the spirit and technical scope of the invention are encompassed in the present disclosure. The embodiments presented below are provided to make the disclosure of the present disclosure complete, and to fully inform the scope of the present disclosure to those skilled in the art to which the present disclosure pertains. In the description of the present disclosure, certain detailed explanations of related art are omitted when it is deemed that they may unnecessarily obscure the essence of the present disclosure.

The terms used in this application are only used to describe specific embodiments, and are not intended to limit the present disclosure. As used herein, the singular forms ("a," "an," and the "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. It will be understood that although the terms "first," "second," etc. may be used herein to describe various components, these components should not be limited by these terms. These terms are used only to distinguish one component from other components.

Hereinafter, embodiments of the present disclosure will be described below in more detail with reference to the accompanying drawings. Those components that are the same or are in correspondence are rendered the same reference numeral regardless of the figure number, and a redundant description therewith is omitted.

FIG. 1 is a schematic configuration view of a battery system for performing a method of estimating a state of health of a battery according to an embodiment.

Referring to FIG. 1, a battery system 100 may include a battery 110, a voltage measurement unit 120, a current measurement unit 130, a microprocessor 140, and a storage unit 150.

The battery 110 is a unit for storing power and may include at least one battery cell. The battery 110 may include a plurality of battery cells, and the plurality of battery cells may be connected in series, in parallel, or in a combination of series and parallel. Each of the battery cells may include a rechargeable secondary cell. For example, each of the battery cells may include a nickel-cadmium battery, a lead-acid battery, a nickel metal hydride (NiMH) battery, a lithium ion battery, or a lithium polymer battery. The number of battery cells included in the battery 110 may be determined according to a required output voltage.

Although one battery 110 is shown in FIG. 1, a plurality of batteries 110 may be connected in parallel and/or in series and may be connected to a load and/or a charging device through external terminals. Although not shown in FIG. 1, the battery 110 may be used while being connected to the load and/or the charging device. Thus, the battery 110 may be discharging current to the load or may be charging power from the charging device.

The voltage measurement unit 120 may be connected to both terminals of the battery 110 being used and may measure the voltage of the battery 110 so as to periodically generate a voltage value. For example, the voltage measurement unit 120 may measure the voltages of both terminals of the battery 110 in every preset time period $\Delta t$. A current or recently measured voltage value is referred to as the current voltage value and is indicated by V(t). A voltage value measured at a time period $\Delta t$ before is referred to as the immediately preceding voltage value and indicated by V(t−1). The time period $\Delta t$ may be, for example, 1 second. However, this is an example, and the time period $\Delta t$ may be set to different times, such as 0.1 seconds, 0.5 seconds, 2 seconds, 5 seconds, or 10 seconds. The time period $\Delta t$ may be properly set according to an electrical system to which the battery system 100 is connected.

Although FIG. 1 shows that the voltage measurement unit 120 measures the voltage of both terminals of the battery 110, when the battery 110 includes a plurality of battery cells, a plurality of battery modules, or a plurality of battery packs, the voltage measurement unit 120 may also measure a voltage of both terminals of each battery cell, each battery module, or each battery pack.

The current measurement unit 130 may measure the current of the battery 110 being used, so as to periodically generate a current value. The voltage measurement unit 120 and the current measurement unit 130 may be synchronized with each other so as to measure a voltage and current of the battery 110 at the same time. The current measurement unit 130 may also measure the current of the battery 110 for every time period $\Delta t$. The current value measured by the current measurement unit 130 may be displayed positive (+) when it is a charging current and negative (−) when it is a discharging current. The currently or recently measured current value may be referred to as a present current value and indicated by I(t), and the current value measured before the time period may be referred to as an immediately preceding current value and indicated by I(t−1).

The microprocessor 140 may update in real time a value of a G parameter and a value of an H parameter that indicate the present state of the battery from the voltage value provided by the voltage measurement unit 120 and the current value provided by the current measurement unit 130. Here, the G parameter may be a parameter indicating the sensitivity of a voltage with respect to a current change of the battery 110 being used, and the H parameter may be a parameter indicating an effective potential determined by local equilibrium potential distribution and resistance distribution.

The microprocessor 140 may use an adaptive filter so as to generate the value of the G parameter and the value of the H parameter from the voltage value and the current value. The adaptive filter may be a filter using a recursive least squares (RLS) method or a filter using a weighted least squares (WLS) method. Hereinafter, an embodiment in which the microprocessor 140 uses an adaptive filter using an RLS method will be described in detail.

The microprocessor 140 may estimate the state of the battery 110 in real time by using the value of the G parameter and the value of the H parameter generated in real time. According to the present disclosure, the microprocessor 140 may estimate the state of health of the battery 110 in real time using the initial value, the final value, and the present value of the G parameter. The initial value and the final value of the G parameter may be preset values. The present value of the G parameter may be generated from the voltage value and the current value using the adaptive filter in real time.

Because the microprocessor 140 uses only a simple operation such as an arithmetic calculation when estimating the state of health of the battery in real time, the microprocessor 140 may be included in the BMS of the battery pack. The method of estimating the state of health of the battery according to the present disclosure may be performed by a micro controller in a BMS of an electronic vehicle or an electronic control unit (ECU). According to another example, the method of estimating the state of health of the battery according to the present disclosure may be performed by an integrated controller of an energy storage system. According to another example, the method of estimating the state of health of the battery according to the present disclosure may be performed by a processor of a server connected by communication to the battery system or the energy storage system.

The storage unit 150 may store commands and data required to perform the method of estimating the state of health according to the present embodiment by the microprocessor 140. In the method of estimating the state of health according to the present embodiment, the value of the G parameter and the value of the H parameter are generated based on the voltage value and the current value generated every time period $\Delta t$ and the state of health of the battery 110 are estimated by using the present value of the G parameter, and thus the storage unit 150 may store the present voltage value, the present current value, and the immediately preceding current value, and other voltage and current data may not be stored in the storage unit 150. That is, the storage unit 150 does not need to store a large amount of voltage and current data.

In the method of estimating the state of health according to the present embodiment, the storage unit 150 may store the initial value and the final value of the G parameter, the immediately preceding value and the current value of a state vector composed of the G parameter and the H parameter, and the immediately preceding value and the current value of a covariance matrix required for the RLS calculation. Moreover, the storage unit 150 may store a state of health score calculated based on the initial value, the final value, and the present value of the G parameter. According to an example, the state of health score may be stored in the storage unit 150 for a preset period. Thus, the storage unit 150 does not need to store a large amount of commands and data and thus may be implemented as memory having a small size. For example, the storage unit 150 may also be implemented as memory inside the microprocessor 140.

The state of health of the battery is also referred to as battery life, battery aging state, and battery deterioration state, and generally defined as a percentage of present capacity respective to the initial capacity of the battery. Conventionally, methods of estimating the state of health by calculating an actual battery capacity by measuring the discharged electric charge using the current sensor, estimating the state of health by using the OCV-SOC relationship, and estimating the state of health by tracking the resistance component or the impedance parameter value of the battery were used. However, these conventional methods have problems of having to discontinue using the battery, having to match certain conditions or environments, or unreliable accuracy due to accumulated sensor errors or estimation errors.

In the method of estimating the state of health by calculating an actual battery capacity by measuring the discharged electric charge using the current sensor, using the battery needs to be discontinued to calculate the battery capacity. In addition, the present capacity needs to be measured in the same environment as the environment where the initial capacity of the battery was measured. Thus, when measuring the present capacity, the temperature and charge/discharge amount thereof need to be identical to those of the initial capacity measured. However, discontinuing use of the battery in an actual battery using an environment or calculating the present capacity by making a certain environment is a burden to the battery system. In addition, in this method, the accuracy of the current sensor may directly affect the accuracy of the estimation of the state of health.

In the method of estimating the state of health using the OCV-SOC relationship, it is difficult to directly measure the SOC in real time. For this reason, SOC is estimated from measurable data (for example, OCV), and the state of health is estimated based on the estimated SOC. However, in estimating the state of health based on the estimated SOC, because measurement error and SOC estimation error may be reflected in the estimation of the state of health, there may be a problem in the accuracy of the estimate of the state of health. In the method of using the OCV-SOC relationship, because the state of health may be estimated only when the battery is operated under a certain SOC condition, the state of health may not be estimated in a regular period.

In the method of estimating the state of health by tracking the resistance component or the impedance parameter value of the battery, normal use of the battery is discontinued, a certain charge/discharge operation waveform such as AC power is applied to the battery to obtain the parameter value of the inside of the battery, and the obtained parameter value is tracked to estimate the state of health. Therefore, the normal operation of the battery needs to be discontinued, and additional operating conditions need to be satisfied to obtain a more accurate parameter value. Because a high-level battery model is required to accurately estimate the state of health based on the obtained parameter value, it may be difficult for the method to be executed in the BMS, which cannot perform complex calibration calculations in real time.

Although there is a method of estimating the state of health based on a look-up table, this method has low adaptability. Batteries have different deterioration characteristics according to a usage pattern. This characteristic is called pattern-dependent deterioration because the relationship between measurable variables (for example, voltage, current, and temperature) of the battery and the parameter indicating the state of health of a battery changes according to the usage pattern. However, after the look-up table is completed through experiments in advance, it is difficult to reflect the usage pattern characteristics. In order to reflect the pattern-dependent deterioration, experiments on all usage pattern characteristics need to be conducted in advance, or the characteristics should be predicted and reflected in the battery model in advance. However, the former has a problem of cost increase, and the latter has a problem wherein the reliability of the estimation of the state of health may be inevitably reduced when the battery model becomes complex and the characteristics cannot be accurately predicted in advance.

In order to overcome the problems of the conventional method of estimating the state of health, the present disclosure provides a method of accurately estimating the state of health in real time by tracking the value of the G parameter among the G parameter and the H parameter, which are parameters inside the battery. The method of estimating the state of health according to the present disclosure may be implemented to be simple enough to be executed in the BMS and may have high accuracy without any additional operating conditions.

The G parameter is a state amount indicating the sensitivity of a terminal voltage to a change in applied current of the battery being used, and has a unit of resistance. The H parameter is the effective potential determined by local equilibrium potential distribution and resistance distribution in the battery during use. The G parameter and the H parameter of the battery may be quantified by explicit correlations between battery material properties and design variables using a theoretical model. Hereinafter, the G parameter and the H parameter of the battery will be described.

In the battery, it may be assumed that a voltage V and a current i has the same relationship as $V=f(i; x, p)$. Here, x is a physical amount indicating the internal state of the battery, and p is a parameter.

A function f may be a nonlinear implicit function. If the function f can be divided into a rapidly changing amount g and a slowly changing amount h, the above relationship equation may be expressed as $V=g(i; x, p)+h(i; x, p)$.

Assuming that there is a function $G(i; x, p)=dg/di$ that changes slowly with respect to the current i, the above relationship equation may be expressed as $V=G(i; x, p)i+H(i; x, p)$.

In the above relationship equation, dG/di and dH/di have very small values. In other words, if the above-described assumptions are satisfied, G and H are functions that change slowly with respect to the current i. Thus, the function f indicating the nonlinear relationship between the voltage V and the current i may be expressed in a quasi-linear relationship.

Here, G is referred to as a G parameter, and H is referred to as an H parameter. When the current i is a charge/discharge current and Ueq is an equilibrium potential of a battery, a discharging overvoltage may be expressed as $Ueq-V=-G\cdot i+(Ueq-H)$ by using the G parameter G and the H parameter H.

Here, $-G\cdot I$ is an overvoltage generated by the battery to flow current through a terminal, and includes a reaction dynamic polarization amount and an electron and ion resistance polarization amount. (Ueq–H) is the overvoltage caused by the local thermodynamic equilibrium of the battery deviating from the overall system equilibrium. That is, (Ueq–H) represents the inefficiency caused by the thermodynamic non-uniformity inside the battery, and when the internal system of the battery reaches the thermodynamic equilibrium state, the H parameter H is equal to the equilibrium potential Ueq.

In the method of estimating the state of health of the battery according to embodiments of the present disclosure, the G parameter G and the H parameter H are extracted directly from the voltage value and the current value measured in the battery by using the RLS method and the G parameter is tracked, for example, and the state of health of the battery may be estimated therethrough.

Figure 2:
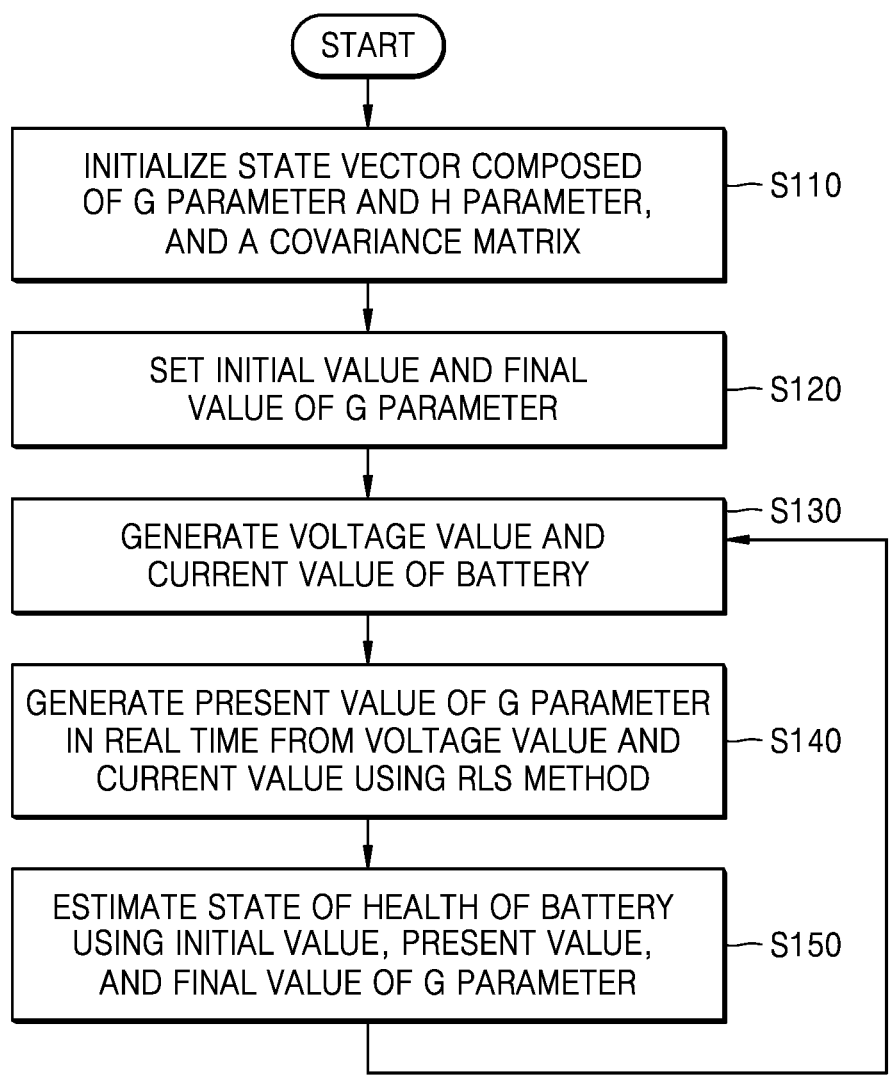
FIG. 2 is a flowchart illustrating a method of estimating a state of health of a battery according to an embodiment.

FIG. 2 is a flowchart illustrating a method of estimating a state of health of a battery according to an embodiment.

Referring to FIGS. 1 and 2, the microprocessor 140 may perform the method of estimating the state of health of the battery shown in FIG. 2 by using an RLS method.

According to the method of estimating the state of health of the battery of the present disclosure, the state vector $\hat{\Theta}(t)$ and the covariance matrix P(t) may be used.

The state vector $\hat{\Theta}(t)$ is composed of the G parameter $\hat{G}(t)$ and the H parameter $\hat{H}(t)$, and may be defined as $$\hat{\Theta}(t) = \begin{bmatrix} \hat{G}(t) \\ \hat{H}(t) \end{bmatrix}.$$

The covariance matrix P(t) is composed of a first value $P_1(t)$ and a second value $P_2(t)$, and may be defined as $$P(t) = \begin{bmatrix} P_1(t) \\ P_2(t) \end{bmatrix}.$$

The voltage value V(t) and the current value I(t) of the battery 110 may be generated every time period Δt, and the state vector $\hat{\Theta}(t)$ and the covariance matrix P(t) may be updated through a recursive method every time period Δt. The G parameter $\hat{G}(t)$ and the H parameter $\hat{H}(t)$ may also be updated every time period Δt.

In the method of estimating the state of health of the battery according to the present embodiment, the microprocessor 140 may initialize the state vector $\hat{\Theta}(t)$ and the covariance matrix P(t) (S110). The state vector $\hat{\Theta}(t)$ may be initialized as $$\hat{\Theta}(0) = \begin{bmatrix} \hat{G}(0) \\ \hat{H}(0) \end{bmatrix} = \begin{bmatrix} 1 \\ 1 \end{bmatrix},$$

and the covariance matrix P(t) may be initialized as $$P(0) = \begin{bmatrix} P_1(0) \\ P_2(0) \end{bmatrix} = \begin{bmatrix} 1 \\ 1 \end{bmatrix}.$$

In the present example, although all of elements of the state vector $\hat{\Theta}(t)$ and elements of the covariance matrix P(t) have been initialized as 1, this is just an example, and these elements may be initialized as another value.

The microprocessor 140 may set the initial value $G^i$ and the final value $G^f$ of the G parameter $\hat{G}(t)$ (S120). The initial value $G^i$ is the value of the G parameter when the state of health is 100, and the final value $G^f$ is the value of the G parameter when the state of health is 0. The initial value $G^i$ and the final value $G^f$ with respect to the battery of which the state of health is 100 and the battery of which the state of health is 0 may each be obtained in advance through an experiment. According to another example, the initial value $G^i$ may be obtained in advance through an experiment with respect to the battery of which the state of health is 100, and the final value $G^f$ may be calculated by correction to minimize the error between the actual state of health of the battery and the estimated state of health of the battery of the present disclosure while performing the method of estimating the state of health of the battery of the present disclosure.

The microprocessor 140 may generate the voltage value and the current value periodically, for example, every time period Δt, by measuring the voltage and current of the battery 110 using the voltage measurement unit 120 and the current measurement unit 130. The microprocessor 140 may generate the immediately preceding voltage value V(t−1) and the immediately preceding current value I(t−1), and may generate the present voltage value V(t) and the present current value I(t) after a time period Δt.

The microprocessor 140 may use the RLS method so as to generate the present value of the G parameter $\hat{G}(t)$ in real time from the voltage value and the current value (S140). In the method of estimating the state of health of the battery according to the present disclosure, the microprocessor 140 may update the G parameter $\hat{G}(t)$ and the H parameter $\hat{H}(t)$ every time period Δt according to the voltage value V(t) and the present current value I(t) being received every time period Δt.

The microprocessor 140 may calculate the present voltage estimate $\hat{V}(t)$ of the battery based on the present current value I(t) and the immediately preceding value $\hat{\Theta}(t-1)$ of the state vector. The immediately preceding value of the state vector $\hat{\Theta}(t-1)$ may be calculated based on the immediately preceding voltage value V(t−1) and the immediately preceding current value I(t−1) at a time period Δt before, and may be composed of the immediately preceding value $\hat{G}(t-1)$ of the G parameter and the immediately preceding value $\hat{H}(t-1)$ of the H parameter. The present voltage estimate $\hat{V}(t)$ of the battery 110 may be a value obtained by adding the immediately preceding value of the H parameter $\hat{H}(t-1)$ to a product of the present current value I(t) and the immediately preceding value of the G parameter $\hat{G}(t-1)$ and may be calculated as $\hat{V}(t)=I(t)\hat{G}(t-1)+\hat{H}(t-1)$.

The microprocessor 140 may update a gain matrix L(t) on the basis of the present current value I(t) and the immediately preceding value P(t−1) of the covariance matrix. The immediately preceding value P(t−1) of the covariance matrix may be calculated based on the immediately preceding voltage value V(t−1) and the immediately preceding current value I(t−1)) at a time period Δt before, and may be composed of a first immediately preceding value $P_1(t-1)$ of the covariance matrix and a second immediately preceding value $P_2(t-1)$ of the covariance matrix according to the definition of the covariance matrix P(t).

The gain matrix L(t) may be used in updating the state vector $\hat{\Theta}(t)$ and the covariance matrix P(t). The gain matrix L(t) may be composed of a first value $L_1(t)$ of the gain matrix L(t) and a second value $L_2(t)$ of the gain matrix L(t), and may be calculated as below.

$$L(t) = \begin{bmatrix} L_1(t) \\ L_2(t) \end{bmatrix} = \frac{1}{1+P_1(t-1)I(t)2/\lambda_1 + P_2(t-1)/\lambda_2} \begin{bmatrix} P_1(t-1)I(t)/\lambda_1 \\ P_2(t-1)/\lambda_2 \end{bmatrix}$$

Here, $\lambda_1$ may be a first forgetting factor relating to a G parameter. $\lambda_2$ may be a second forgetting factor relating to an H parameter. The first forgetting factor $\lambda_1$ and the second forgetting factor $\lambda_2$ are values in which, when the G parameter $\hat{G}(t)$ and the H parameter $\hat{H}(t)$ are calculated, the effect of the past voltage value and the past current value on a present value $\hat{G}(t)$ of the G parameter and a present value $\hat{H}(t)$ of the H parameter is indicated. As getting close to 1, the first forgetting factor $\lambda_1$ and the second forgetting factor $\lambda_2$ affect the present value $\hat{G}(t)$ of the G parameter and the present value $\hat{H}(t)$ of the H parameter during a long time, and as getting close to zero, they affect the present value of the G parameter and the present value of the H parameter only during a short time.

According to an example, the first forgetting factor $\lambda_1$ and the second forgetting factor $\lambda_2$ may be greater than or equal to 0.9 and less than or equal to 1. According to another example, the first forgetting factor $\lambda_1$ may be set as a value that is greater than or equal to the second forgetting factor $\lambda_2$. For example, the first forgetting factor $\lambda_1$ may be set as 0.99999, and the second forgetting factor $\lambda_2$ may be set as 0.95. These setting values may vary according to characteristics of the battery 110.

The inventors of the present disclosure have found that the high reliability results were derived when the first forgetting factor $\lambda_1$ and the second forgetting factor $\lambda_2$ were 0.99999 and 0.95, respectively, in an experiment performed on a certain battery. However, the above values are examples, and other values may be set according to the characteristics of the battery 110. For example, the first forgetting factor $\lambda_1$ may be set as 0.9999, and the second forgetting factor $\lambda_2$ may be set as 0.98.

In another example, all of the first forgetting factor $\lambda_1$ and the second forgetting factor $\lambda_2$ may also be set as 1. In this case, it may be regarded that the first forgetting factor $\lambda_1$ and the second forgetting factor $\lambda_2$ were not applied.

The microprocessor 140 may update the covariance matrix $P(t)$ based on the present current value $I(t)$, the gain matrix $L(t)$, and the immediately preceding value $P(t-1)$ of the covariance matrix. The covariance matrix $P(t)$ ma be calculated as below.

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)I(t)\}P_2(t-1)/\lambda_2 \end{bmatrix}$$

The microprocessor 140 may calculate a voltage error $e(t)$ between the present voltage value $V(t)$ and the present voltage estimate kit $\hat{V}(t)$ calculated earlier, as $e(t)=V(t)-\hat{V}(t)$.

The microprocessor 140 may update the state vector $\hat{\Theta}(t)$ based on the immediately preceding value $\hat{\Theta}(t-1)$ of the state vector, the present value $L(t)$ of the gain matrix, and the voltage error $e(t)$. By the update of the state vector $\hat{\Theta}(t)$, the present value $\hat{G}(t)$ of the G parameter and the present value $\hat{H}(t)$ of the H parameter may be generated.

The present value $\hat{\Theta}(t)$ of the state vector may be calculated as a value obtained by adding a product of the present value $L(t)$ of the gain matrix and the voltage error $e(t)$ to the immediately preceding value $\hat{\Theta}(t-1)$ of the state vector as follows.

$$\hat{\Theta}(t) = \begin{bmatrix} \hat{G}(t) \\ \hat{H}(t) \end{bmatrix} = \hat{\Theta}(t-1) + L(t) \times e(t)$$

The above equation in which the state vector $\hat{\Theta}(t)$ is recursively expressed, may be derived as below.

Firstly, a loss-function $\epsilon$ to which the first forgetting factor $\lambda_1$ and the second forgetting factor $\lambda_2$ are applied, is defined as below.

$$\epsilon(\hat{G}(t), \hat{H}(t), t) = \frac{1}{2}\sum_{i=1}^{t} \lambda_1^{t-i}\{V(i) - I(i)\hat{G}(t) - H(i)\}^2 + \frac{1}{2}\sum_{i=1}^{t} \lambda_2^{t-i}\{V(i) - I(i)G(i) - \hat{H}(t)\}^2$$

Here, $V(i)$ is an i-th voltage value, and $I(i)$ is an i-th current value. $V(t)$ and $I(t)$ are the present voltage value and the present current value, respectively, and $V(t-1)$ and $I(t-1)$ are the immediately preceding voltage value and the immediately preceding current value.

$G(i)$ and $H(i)$ are actual values of an i-th G parameter and an i-th H parameter, respectively, and $\hat{G}(t)$ and $\hat{H}(t)$ are a present value estimate of the G parameter and a present value estimate of the H parameter, respectively.

When the results of differentiating the loss-function $\epsilon$ for $\hat{G}(t)$ and $\hat{H}(t)$, respectively, are zero, the loss-function $\epsilon$ for $\hat{G}(t)$ and $\hat{H}(t)$ may be minimum.

$\hat{G}(t)$ in which the results in which the loss-function $\epsilon$ is differentiated for $\hat{G}(t)$ are zero, is obtained as below.

$$\frac{\partial \epsilon}{\partial \hat{G}(t)} = 0$$

$$\sum_{i=1}^{t} \lambda_1^{t-i}(-I(i))\{V(i) - I(i)\hat{G}(t) - H(i)\} = 0$$

Summarizing the above equation, $\hat{G}(t)$ is as follows.

$$\hat{G}(t) = \frac{\sum_{i=1}^{t} \lambda_1^{t-i}\{V(i) - H(i)\}}{\sum_{i=1}^{t} \lambda_1^{t-i} I(i)^2}$$

$\hat{H}(t)$ in which the results in which the loss-function $\epsilon$ is differentiated for $\hat{H}(t)$ are zero, is obtained as below.

$$\hat{H}(t) = \frac{\sum_{i=1}^{t} \lambda_2^{t-i}\{V(i) - I(i)G(i)\}}{\sum_{i=1}^{t} \lambda_2^{t-i}}$$

For real time estimation, $\hat{G}(t)$ and $\hat{H}(t)$ obtained earlier are summarized in a recursive form by using the state vector $\hat{\Theta}(t)$ as follows.

$$\hat{\Theta}(t) = \begin{bmatrix} \hat{G}(t) \\ \hat{H}(t) \end{bmatrix} = \hat{\Theta}(t-1) + L(t) \times (V(t) - I(t)\hat{G}(t-1) - \hat{H}(t-1))$$

Because the present voltage estimate $\hat{V}(t)$ may be defined as $\hat{V}(t)=I(t)\hat{G}(t-1)+\hat{H}(t-1)$, and the voltage error $e(t)$ may be defined as $e(t)=V(t)-\hat{V}(t)$, the state vector $\hat{\Theta}(t)$ may be expressed as below, as described above.

$$\hat{\Theta}(t) = \begin{bmatrix} \hat{G}(t) \\ \hat{H}(t) \end{bmatrix} = \hat{\Theta}(t-1) + L(t) \times e(t)$$

Here, the gain matrix L(t) and the covariance matrix P(t) may be calculated as below, as described above.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

Because the method of estimating the state of health of the battery uses the recursive method, the storage unit 150 may only store the present current value I(t), the state vector $\hat{\Theta}(t)$, and the covariance matrix P(t). The microprocessor 140 may generate the present value $\hat{G}(t)$ of the G parameter in real time through the state vector $\hat{\Theta}(t)$ stored in the storage unit 150. According to another example, the first forgetting factor $\lambda_1$ and the second forgetting factor $\lambda_2$ may be further stored in the storage unit 150. All of the past voltage values and current values do not need to be stored in the storage unit 150.

Because the method of estimating the state of health of the battery shown in FIG. 2 uses the recursive method, calculations are very simple, and calculations may be made only using the storage unit 150 having a small size of several KB. Furthermore, because the state vector $\hat{\Theta}(t)$ and the covariance matrix P(t) are newly updated whenever the voltage value and the current value are received, voltage and current fluctuations of the battery 110 may be substantially reflected on the G parameter $\hat{G}(t)$ and the H parameter $\hat{H}(t)$ in real time.

The microprocessor 140 may estimate the state of health of the battery 110 in real time by using the initial value $G^i$ and the final value $G^f$ of the G parameter set in Operation S120, and the present value $\hat{G}(t)$ of the G parameter generated in Operation S140 (S150). The microprocessor 140 may estimate the state of health of the battery 110 based on a percentage value $(G^f-\hat{G}(t))/(G^f-G^i)*100$ of the difference $G^f-G^i$ between the final value $G^f$ of the G parameter and the initial value $G^i$ and of the G parameter relative to the difference $G^f-\hat{G}(t)$ between the final value $G^f$ of the G parameter and the present value $\hat{G}(t)$ of the G parameter. According to an example, the value of the state of health of the battery 110 may be calculated as the percentage value $(G^f-\hat{G}(t))/(G^f-G^i)*100$. According to another example, the percentage value $(G^f-\hat{G}(t))/(G^f-G^i)*100$ may be defined as the state of health score, and the value of the state of health of the battery 110 may be estimated based on an average of the state of health scores from present to a certain period. Here, the certain period may be 1 week, 2 weeks, 3 weeks, 4 weeks, 8 weeks, and 12 weeks. The calculated average may be referred to as a moving average of the certain period. According to another example, the value of the state of health of the battery 110 may be estimated based on a weighted moving average that gives higher weight to state of health scores that are obtained at a time closer to the present and lower weights to state of health scores that are obtained at a time closer to the past.

The microprocessor 140 may repeatedly perform Operations S130 to S150 every time period Δt in which the voltage value V(t) and the current value I(t) of the battery 110 are measured. According to an embodiment, the microprocessor 140 may calculate the state of health score of the battery 110 based on the initial value $G^i$ and final value $G^f$ of the G parameter set in Operation S120 and the present value $\hat{G}(t)$ of the G parameter generated in Operation S140 every time period Δt, and store the state of health score in the storage unit 150. The microprocessor 140 may estimate the value of the state of health of the battery 110 based on the state of health scores stored in the storage unit 150 for a certain period. For example, the microprocessor 140 may statistically process the state of health scores and calculate the value of the state of health. For example, the moving average or the weighted moving average may be used.

Figure 3:
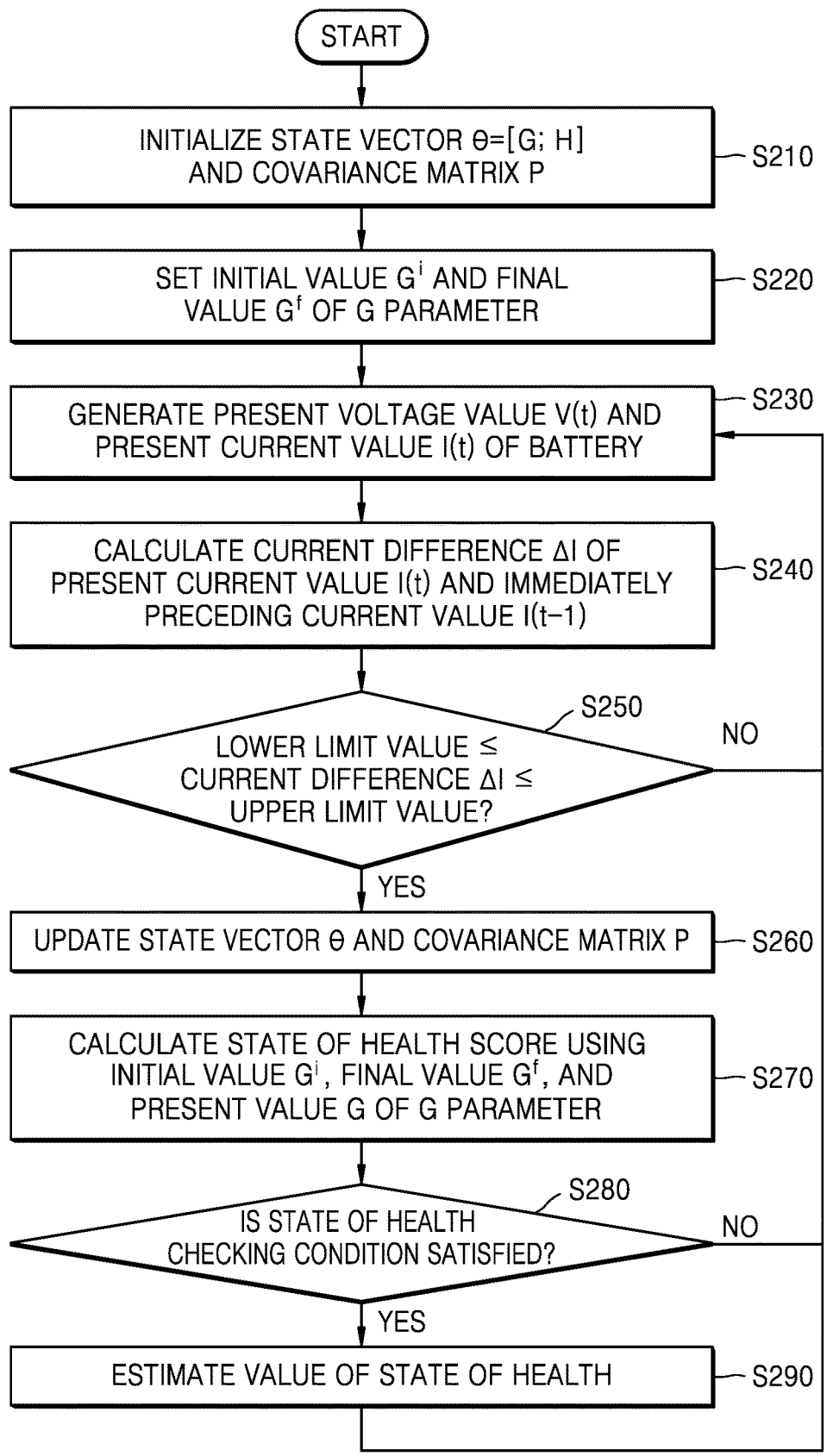
FIG. 3 is a flowchart illustrating a method of estimating a state of health of a battery according to another embodiment.

FIG. 3 is a flowchart illustrating a method of estimating a state of health of a battery according to another embodiment.

Some of the operations of the method of estimating the state of health of the battery of FIG. 3 are substantially the identical to the method of estimating the state of health of the battery of FIG. 3. Repeated descriptions will not be given again. The method of estimating the state of health of the battery illustrated in FIG. 3 may be performed by the microprocessor 140 of FIG. 1.

Referring to FIGS. 1 to 3, the microprocessor 140 may initialize the state vector $\hat{\Theta}(t)$ and the covariance matrix P(t) (S210). The state vector $\hat{\Theta}(t)$ includes the G parameter $\hat{G}(t)$ and the H parameter $\hat{H}(t)$, and the covariance matrix P(t) includes the first value $P_1(t)$ and the second value $P_2(t)$. The state vector $\hat{\Theta}(t)$ may be initialized as $$\hat{\Theta}(0) = \begin{bmatrix} \hat{G}(0) \\ \hat{H}(0) \end{bmatrix} = \begin{bmatrix} 1 \\ 1 \end{bmatrix},$$

and the covariance matrix P(t) may be initialized as $$P(0) = \begin{bmatrix} P_1(0) \\ P_2(0) \end{bmatrix} = \begin{bmatrix} 1 \\ 1 \end{bmatrix}.$$

All elements of the state vector $\hat{\Theta}(t)$ and the covariance matrix P(t) have been initialized to 1 as an example, but may be initialized to other values such as 0, and may each be initialized to values different from each other.

The microprocessor 140 may set the initial value $G^i$ and the final value $G^f$ of the G parameter $\hat{G}(t)$ (S220). Operation S220 may be performed earlier than Operation S210. The initial value $G^i$ and the final value $G^f$ may be input by an administrator, obtained by a calculation of the microprocessor 140, or externally received. The initial value $G^i$ corresponds to the value of the G parameter when the state of health is 100, and the final value $G^f$ corresponds to the value of the G parameter when the state of health is 0.

The microprocessor 140 may measure the voltage and current of the battery 110 and generate the voltage value and the current value every time period Δt (S230). For example, the immediately preceding voltage value V(t−1) and the immediately preceding current value I(t−1) may be generated, and the present voltage value V(t) and the present current value I(t) may be generated after a time period Δt. Because the method of estimating the state of health of the battery of FIG. 3 uses the RLS, the state vector $\hat{\Theta}(t)$ and covariance matrix P(t), and the G parameter $\hat{G}(t)$ and the H parameter $\hat{H}(t)$ may also be updated every time period $\Delta t$ by the recursive method.

The microprocessor 140 may calculate a current difference $\Delta I$ between the present current value I(t) and the immediately preceding current value I(t−1) (S240). According to an example, the current difference $\Delta I$ may be a value, that is, I(t)−I(t−1), wherein the immediately preceding current value I(t−1) is subtracted from the present current value I(t). According to another example, the current difference $\Delta I$ may be a difference between a present current value I(t) and the immediately preceding current value I(t−1), that is, an absolute value (that is, |I(t)−I(t−1)|) wherein the immediately preceding current value I(t−1) is subtracted from the present current value I(t). The storage unit 150 may store the immediately preceding current value I(t−1) to calculate the current difference $\Delta I$.

The microprocessor 140 may compare the current difference $\Delta I$ with a certain range (S250). The certain range may be defined by a lower limit value and an upper limit value, and may be preset by the administrator. The microprocessor 140 may determine whether the current difference $\Delta I$ is within the range between the lower limit value and the upper limit value. The certain range may be set according to the charge/discharge current pattern of the battery system 100. The lower limit value and the upper limit value may be set based on the charge/discharge rate of the battery system 100. For example, the lower limit value may be set to 0.2 C and the upper limit value may be set to 1 C.

When the current difference $\Delta I$ is too small or too large, due to the recursive method, the sensing error of the voltage value and the current value may cause large deviation to the G parameter $\hat{G}(t)$ and the H parameter $\hat{H}(t)$. The certain range may be suitable for calculating the value of the state of health accurately. When the current difference $\Delta I$ is within the certain range, the microprocessor 140 may proceed to Operation S260 to update the state vector $\hat{\Theta}(t)$ and the covariance matrix P(t) based on the present voltage value V(t) and the present current value I(t). However, when the current difference $\Delta I$ exceeds the certain range, the microprocessor 140 may proceed to Operation S230 to generate the voltage value and the current value after a time period $\Delta t$. Thus, when the current difference $\Delta I$ exceeds the certain range, the state vector $\hat{\Theta}(t)$ and the covariance matrix P(t) may not be updated, and the present voltage value V(t) and the present current value I(t) may not affect the state vector $\hat{\Theta}(t)$ and the covariance matrix P(t).

The microprocessor 140 may use the RLS method so as to update the state vector $\hat{\Theta}(t)$ and the covariance matrix P(t) based on the voltage value and the current value (S260).

As an example, the microprocessor 140 may calculate the present voltage estimate $\hat{V}(t)$ of the battery based on the present current value I(t) and the immediately preceding value $\hat{\Theta}(t-1)$ of the state vector. The present voltage estimate $\hat{V}(t)$ may be calculated as $\hat{V}(t)=I(t)\hat{G}(t-1)+\hat{H}(t-1)$.

The microprocessor 140 may update the gain matrix L(t) on the basis of the present current value I(t) and the immediately preceding value P(t−1) of the covariance matrix. The gain matrix L(t) may be calculated as below.

$$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda \\ P_2(t-1)/\lambda_2 \end{bmatrix}$$

The microprocessor 140 may update the covariance matrix P(t) based on the present current value I(t), the gain matrix L(t), and the immediately preceding value P(t−1) of the covariance matrix. The covariance matrix P(t) may be calculated as below.

$$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

Here, $\lambda_1$ is a first forgetting factor relating to the G parameter, and $\lambda_2$ is a second forgetting factor relating to the H parameter.

The microprocessor 140 may update the state vector $\hat{\Theta}(t)$ based on the immediately preceding value $\hat{\Theta}(t-1)$ of the state vector, the present value L(t) of the gain matrix, and the voltage error e(t). The present value $\hat{\Theta}(t)$ of the state vector may be calculated as below.

$$\hat{\Theta}(t) = \begin{bmatrix} \hat{G}(t) \\ \hat{H}(t) \end{bmatrix} = \hat{\Theta}(t-1) + L(t) \times e(t)$$

Here, the voltage error e(t) may be calculated as e(t)=V(t)−$\hat{V}$(t) based on the present voltage value V(t) and the present voltage estimate $\hat{V}(t)$.

By the update of the state vector $\hat{\Theta}(t)$ in Operation S260, the present value $\hat{G}(t)$ of the G parameter and the present value $\hat{H}(t)$ of the H parameter may be generated. The particular method of updating the state vector $\hat{\Theta}(t)$ and the covariance matrix P(t) and the related equations have been described above with reference to FIG. 2, and thus will not be explained repeatedly.

The microprocessor 140 may calculate the state of health score of the battery 110 by using the initial value $G^i$ and the final value $G^f$ of the G parameter set in Operation S220, and the present value $\hat{G}(t)$ of the G parameter generated in Operation S260 (S270). The state of health score may be calculated as a percentage value $(G^f-\hat{G}(t))/(G^f-G_i)*100$ of the difference $G^f-G^i$ between the final value $G^f$ of the G parameter and the initial value $G^i$ and of the G parameter relative to the difference $G^f-\hat{G}(t)$ between the final value $G^f$ of the G parameter and the present value $\hat{G}(t)$ of the G parameter. The state of health score may be generated every time period $\Delta t$. The microprocessor 140 may store the state of health score calculated in Operation S270 in the storage unit 150. When the current difference $\Delta I$ exceeds the certain range in Operation S250, the state of health score corresponding to the time may not be stored or null corresponding to the time may be stored in the storage unit 150. The state of health scores may be stored in the storage unit 150 in relation to the generated time. A preset number of state of health scores may be stored in the storage unit 150.

The microprocessor 140 may determine whether a state of health checking condition is satisfied (S280). Because the method of estimating the state of health of the battery of FIG. 3 uses the recursive method, a certain amount of time is required for a result that is consistent with the reality to be generated. For example, because the state vector $\hat{\Theta}(t)$ is initialized in Operation S210, right after the initialization, the G parameter value $\hat{G}(t)$ may have a value close to the initialized value. Because the initialized value may have a large effect on such value, the value may be different from an actual G parameter value and may be unreliable. The state of health checking condition may be determined based on the stored period of the state of health scores generated in Operation S260. For example, the state of health checking condition may indicate whether the state of health score has been saved during a recent first period. Here, the first period may be a certain period such as 1 week, 2 weeks, 3 weeks, 4 weeks, 8 weeks, 12 weeks, and 16 weeks. The state of health score calculated before the first period is passed after the state vector $\hat{\Theta}(t)$ and the covariance matrix P(t) are initialized may not reflect the actual state of health of the battery 110. According to another example, the state of health checking condition may indicate whether the number of state of health scores stored in the storage unit 150 is or more than the preset number. The number of state of health scores may correspond to the number of cycles in the recursive method. The state of health checking condition may be set based on the number of state of health scores.

When the state of health checking condition is satisfied, the microprocessor 140 may proceed to Operation S290 to estimate the value of the state of health. When the state of health checking condition is not satisfied, the microprocessor 140 may not estimate the value of the state of health and may proceed to Operation S230.

The microprocessor 140 may estimate the value of the state of health of the battery 110 based on the state of health scores stored in the storage unit 150. According to an example, the value of the state of health may be estimated based on the state of health scores stored from before a second period to the present. For example, the value of the state of health may be calculated as the moving average of the state of health scores of the second period. According to another example, the value of the state of health may be calculated as the weighted moving average of the state of health scores of the second period. According to an example, the second period may be identical to the first period. According to another example, the second period may be shorter than the first period. For example, the first period may be 8 weeks, and the second period may be 4 weeks. According to another example, the value of the state of health may be calculated based on the predetermined number of state of health scores recently stored. In this case, the moving average or weighted moving average may be used.

Figure 4:
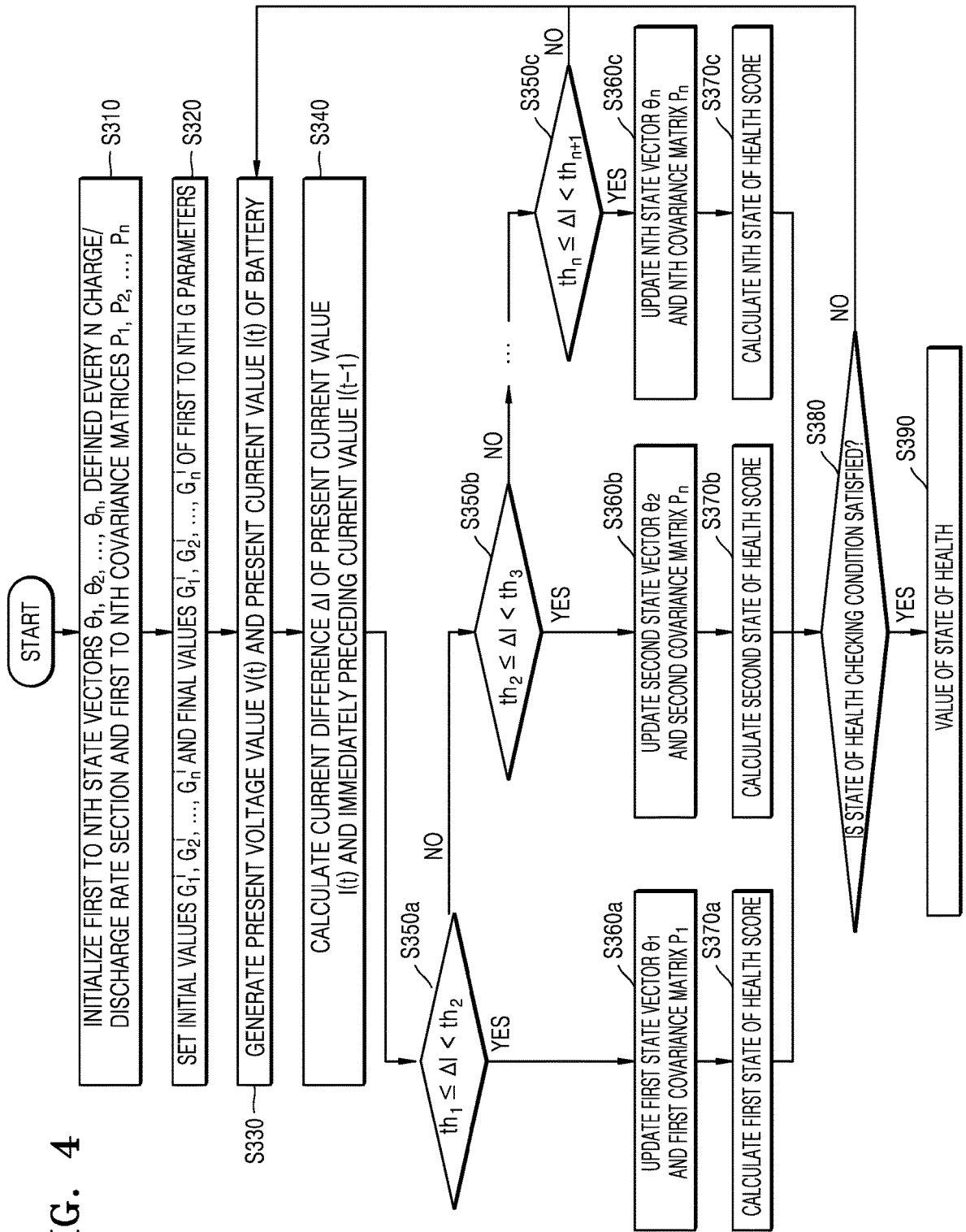
FIG. 4 is a flowchart illustrating a method of estimating a state of health of a battery according to another embodiment.

FIG. 4 is a flowchart illustrating a method of estimating a state of health of a battery according to another embodiment.

A significant part of the method of estimating the state of health of the battery of FIG. 4 overlaps with the method of estimating the state of health of the battery of FIG. 3, except that a certain range in Operation S250 is divided into n charge/discharge rate sections, and that there are n state vectors, covariance matrices, initial values and final values of G parameters, and state of health scores each. Therefore, descriptions thereof already given above are not repeated.

The method of updating the state vector and the covariance matrix including the G parameter and the H parameter and the related equations have been described above with reference to FIGS. 2 and 3. Therefore, descriptions thereof are not repeated. In FIGS. 2 and 3, the state vector, covariance matrix, G parameter, and H parameter are each indicated by "$\hat{\Theta}(t)$", "P(t)", "$\hat{G}(t)$", and "$\hat{H}(t)$." However, in the description regarding the method of estimating the state of health of the battery of FIG. 4, the state vector is indicated by "$\Theta$," the covariance matrix is indicated by "P," the G parameter is indicated by "G," and the H parameter is indicated by "H." Although briefly described as above, those skilled in the art will easily understand a way to update the state vector $\Theta$ composed of the G parameter G and the H parameter H and the covariance matrix P with reference to the description of FIGS. 2 and 3.

The method of estimating the state of health of the battery illustrated in FIG. 4 may be performed by the microprocessor 140 of FIG. 1. According to the method of estimating the state of health of the battery of FIG. 4, a certain range in which the current difference ΔI is compared may be divided into n charge/discharge rate sections that do not overlap each other in Operation S250. Here, n may be a natural number. For example, n may be 3. However, n may be a natural number less than 3, for example, 1 or 2, or may be greater than 3, for example, 4, 5, or 6. n may be set based on the performance of the microprocessor 140 and the capacity of the storage unit 150. When the performance of the microprocessor 140 is excellent and the capacity of the storage unit 150 is large, n may be set to a large value as possible. n may be set according to the charge/discharge current pattern of the battery system 100. When the fluctuation of the charge/discharge current is large, n may be set to be large, but when the fluctuation of the charge/discharge current is small, n may be set to be small.

To define the n charge/discharge rate sections, first to (n+1)th threshold values $th_1, th_2, \ldots, th_{n+1}$ may be defined. A first charge/discharge rate section may be defined as greater than or equal to the first threshold value $th_1$ and less than the second threshold value $th_2$. A second charge/discharge rate section may be defined as greater than or equal to the second threshold value $th_2$ and less than the third threshold value $th_3$. In this manner, an nth charge/discharge rate section may be defined as greater than or equal to an nth threshold value $th_n$ and less than an (n+1)th threshold value $th_{n+1}$.

The first to (n+1)th threshold value ($th_1, th_2, \ldots, th_{n+1}$) may be set according to the capacity of the battery 110. For example, the first threshold value $th_1$ may be set as a current value that corresponds to a charge/discharge rate of 0.1 C. For example, when the capacity of the battery 110 is 100 Ah, the first threshold value $th_1$ may be set to 10 A that corresponds to a charge/discharge rate of 0.1 C. For example, the second threshold value $th_2$ may be set as a current value that corresponds to a charge/discharge rate of 0.2 C, and the third threshold value $th_3$ may be set as a current value that corresponds to a charge/discharge rate of 0.3 C. For example, the (n+1)th threshold value $th_{n+1}$ may be set as a current value that corresponds to a charge/discharge rate of 0.1 C. The values described above are examples only, and they do not limit the present disclosure.

First to nth state vectors $\Theta_1, \Theta_2, \ldots, \Theta_n$, and first to nth covariance matrices $P_1, P_2, \ldots, P_n$ may be prepared. The storage unit 150 may store the first to nth state vectors $\Theta_1, \Theta_2, \ldots, \Theta_n$, and the first to nth covariance matrices $P_1, P_2, \ldots, P_n$. The first to nth state vectors $\Theta_1, \Theta_2, \ldots, \Theta_n$ may include first to nth G parameters $G_1, G_2, \ldots, G_n$ and first to nth H parameters $H_1, H_2, \ldots, H_n$, respectively.

The microprocessor 140 may initiate the first to nth state vectors $\Theta_1, \Theta_2, \ldots, \Theta_n$, and the first to nth covariance matrices $P_1, P_2, \ldots, P_n$ (S310). All elements of the first to nth state vectors $\Theta_1, \Theta_2, \ldots, \Theta_n$ and the first to nth covariance matrices $P_1, P_2, \ldots, P_n$ may be initiated to any number (for example, 1).

The microprocessor 140 may set the initial values $G_1^i, G_2^i, \ldots, G_n^i$ and the final values $G_1^f, G_2^f, \ldots, G_n^f$ of the first to nth G parameters $G_1, G_2, \ldots, G_n$, respectively (S320). Operation S320 may be performed earlier than Operation S310. The initial values $G_1^i, G_2^i, \ldots, G_n^i$ and the final values $G_1^f, G_2^f, \ldots, G_n^f$ may be input by the administrator, obtained by a calculation of the microprocessor 140, or externally received.

The microprocessor 140 may measure the voltage and current of the battery 110 and generate the voltage value and the current value every time period Δt (S330). For example, the immediately preceding voltage value V(t−1) and the immediately preceding current value I(t−1) may be generated, and the present voltage value V(t) and the present current value I(t) may be generated after a time period Δt. Because the method of estimating the state of health of the battery of FIG. 4 uses the RLS, one of the first to nth state vectors $\Theta_1, \Theta_2, \ldots, \Theta_n$ and one of the corresponding first to nth covariance matrices $P_1, P_2, \ldots, P_n$ may be updated by the recursive method.

The microprocessor 140 may calculate a current difference ΔI between the present current value I(t) and the immediately preceding current value I(t−1) (S340).

The microprocessor 140 may determine to what charge/discharge rate section among the first to nth charge/discharge rate sections the current difference ΔI belongs.

Whether the current difference ΔI belongs to the first charge/discharge rate section greater than or equal to the first threshold value $th_1$ and less than the second threshold value $th_2$ may be determined (S350a). When the current difference ΔI belongs to the first charge/discharge rate section, the microprocessor 140 may update the first state vector $\Theta_1$ and the first covariance matrix $P_1$ corresponding to the first charge/discharge rate section (S360a). By updating the first state vector $\Theta_1$, a present value $G_1(t)$ of the first G parameter and a present value $H_1(t)$ of the first H parameter may be generated.

When the current difference ΔI does not belong to the first charge/discharge rate section, the microprocessor 140 may determine whether the current difference ΔI belongs to the second charge/discharge rate section greater than or equal to the second threshold value $th_2$ and less than the third threshold value $th_3$ (S350b). When the current difference ΔI belongs to the second charge/discharge rate section, the microprocessor 140 may update the second state vector $\Theta_2$ and the second covariance matrix $P_2$ corresponding to the second charge/discharge rate section (S360b). By updating the second state vector $\Theta_2$, a present value $G_2(t)$ of the second G parameter and a present value $H_2(t)$ of the second H parameter may be generated.

When the current difference ΔI does not belong to the second charge/discharge rate section, the microprocessor 140 may determine whether the current difference ΔI belongs to a third charge/discharge rate section. In this manner, whether the current difference ΔI belongs to the remaining charge/discharge rate section may be determined. When the current difference ΔI belongs to a jth charge/discharge rate section greater than or equal to a jth threshold value $th_j$ and less than a (j+1)th threshold value $th_{j+1}$, the microprocessor 140 may update a jth state vector and a jth covariance matrix, and by updating the jth state vector, the a present value $G_j(t)$ of a jth G parameter and a present value $H_j(t)$ of a jth H parameter may be generated. When the current difference ΔI does not belong to the first to (n−1)th charge/discharge rate sections, the microprocessor 140 may determine whether the current difference ΔI belongs to the nth charge/discharge rate section greater than or equal to the nth threshold value $th_n$ and less than the (n+1)th threshold value $th_{n+1}$ (S350c).

When the current difference ΔI belongs to the nth charge/discharge rate section, the microprocessor 140 may update the nth state vector $\Theta_n$ and the nth covariance matrix $P_n$ (S360c). By updating the nth state vector $\Theta_n$, a present value $G_n(t)$ of the nth G parameter and a present value $H_n(t)$ of the nth H parameter may be generated. When the current difference ΔI does not belong to the first to nth charge/discharge rate sections, that is, when the current difference ΔI is less than the first threshold value or greater than or equal to the (n+1)th threshold value, the microprocessor 140 may proceed to Operation S330 and may not use the current difference ΔI in updating the first to nth state vectors $\Theta_1, \Theta_2, \ldots, \Theta_n$ and the first to nth covariance matrices $P_1, P_2, \ldots, P_n$.

A method of updating the jth state vector $\Theta_j$ and the jth covariance matrix $P_j$ will be explained. The present voltage estimate $\hat{V}$ of the battery 110 may be calculated based on the present current value I(t) and a recent value $\Theta_j'$ of the jth state vector. The recent value $\Theta_j'$ of the jth state vector means a value of the jth state vector $\Theta_j$ stored in the storage unit 150. The gain matrix L may be calculated based on the present current value I(t) and a recent value $P_j'$ of the jth covariance matrix. The recent value $P_j'$ of the jth covariance matrix means a value of the jth covariance matrix $P_j$ stored in the storage unit 150.

The jth covariance matrix $P_j$ may be calculated based on the present current value I(t), the gain matrix L, and the recent value $P_j'$ of the jth covariance matrix. Even when the gain matrix L and the jth covariance matrix $P_j$ are calculated, the first forgetting factor $\lambda_1$ relating to the jth G parameter $G_j$ and the second forgetting factor $\lambda_2$ relating to the jth H parameter $H_j$ may be applied. The voltage error e is calculated by subtracting the present voltage estimate $\hat{V}$ from the current voltage value V(t). The jth state vector $\Theta_j$ may be calculated based on the recent value $\Theta_j'$ of the jth state vector, the gain matrix L calculated earlier, and the voltage error e.

The equations for calculating the present voltage estimate $\hat{V}$, the gain matrix L, the jth covariance matrix $P_j$, and the jth state vector $\Theta_j$ have been described above with reference to FIG. 2 and thus, will not be repeatedly explained.

The microprocessor 140 may calculate first to nth states of health scores $SOH_1, SOH_2, \ldots, SOH_n$ using the initial values $G_1^i, G_2^i, \ldots, G_n^i$ and final values $G_1^f, G_2^f, \ldots, G_n^f$ of each of the first to nth G parameters $G_1, G_2, \ldots, G_n$ generated in Operation S320 and the present values $G_1(t), G_2(t), \ldots, G_n(t)$ of the first to nth G parameters $G_1, G_2, \ldots, G_n$ generated in Operations S360a-S360c. The first to nth states of health scores $SOH_1, SOH_2, \ldots, SOH_n$ may correspond to the first to nth charge/discharge rate sections, respectively, and may be calculated based on the initial values $G_1^i, G_2^i, \ldots, G_n^i$ and final values $G_1^f, G_2^f, \ldots, G_n^f$ of each of the first to nth G parameters $G_1, G_2, \ldots, G_n$ and the present values $G_1(t), G_2(t), \ldots, G_n(t)$ of the first to nth G parameters $G_1, G_2, \ldots, G_n$. Thus, the jth state of health score $SOH_j$ may be calculated based on an initial value $G_j^i$ and a final value $G_j^f$ of the jth G parameter and the present value $G_j(t)$ of the jth G parameter.

The microprocessor 140 may calculate the first state of health score $SOH_1$ based on an initial value $G_1^i$, a final value $G_1^f$, and the present value $G_1(t)$ of the first G parameter (S370a). For example, a time t of the first state of health score $SOH_1[t]$ may be calculated as $SOH_1[t]=(G_1^f-G_1(t))/(G_1^f-G_1^i)*100$.

The microprocessor 140 may calculate a second state of health score $SOH_2$ based on an initial value $G_2^i$, a final value $G_2^f$, and the present value $G_2(t)$ of the second G parameter (S370b). For example, a time t of the second state of health score $SOH_2[t]$ may be calculated as $SOH_2[t]=(G_2^f-G_2(t))/(G_2^f-G_2^i)*100$.

In this manner, the microprocessor 140 may calculate the nth state of health score $SOH_n$. based on an initial value $G_n^i$, a final value $G_n^f$, and the present value $G_n(t)$ of the nth G parameter (S370c). For example, a time t of the nth state of health score $SOH_n[t]$ may be calculated as $SOH_n[t]=(G_n^f - G_n(t))/(G_n^f - G_n^i)*100$.

The current difference ΔI of a certain time t may belong to any one charge/discharge rate section, or may not belong to any charge/discharge rate section. When the current difference ΔI of a certain time t belongs to a kth charge/discharge rate section, among the first to nth states of health scores $SOH_1$, $SOH_2$, ..., $SOH_n$, a kth state of health score $SOH_k$ corresponding to the kth charge/discharge rate section may be calculated. When the current difference ΔI of a certain time t does not belong to any section, the first to nth states of health scores $SOH_1$, $SOH_2$, ..., $SOH_n$, are not generated at the certain time t.

For example, when the current difference ΔI of an immediately preceding time t−1 belongs to the first charge/discharge rate section, the first state of health score $SOH_1$ may be calculated at the immediately preceding time t−1, and null may be stored in the second to nth state of health scores $SOH_2$, ..., $SOH_n$ at an immediately preceding time t−1. When the current difference ΔI of a present time t belongs to the jth charge/discharge rate section, the jth state of health score $SOH_j$ may be calculated at the present time t, and null may be stored in the first to (j−1)th and (j+1)th to nth state of health scores $SOH_1$, ..., $SOH_{(j-1)}$, $SOH_{(j+1)}$, ..., $SOH_n$ of the present time t.

According to another example, because any one of the first to nth states of health scores $SOH_1$, $SOH_2$, ..., $SOH_n$ is calculated at a certain time t, the first state of health score $SOH_1$ calculated at the immediately preceding time t−1 and the jth state of health score $SOH_j$ calculated at the present time t may be managed as one state of health score SOH. For example, the first to nth states of health scores $SOH_1$, $SOH_2$, ..., $SOH_n$ may not be stored in a memory during a certain period, and the state of health score SOH of a certain period may be stored in the memory. In this case, the first state of health score $SOH_1$ calculated at the immediately preceding time t−1 may be the state of health score SOH[t−1], and the jth state of health score $SOH_j$ calculated at the present time t may be the state of health score SOH[t].

Every time period Δt, any one state of health score SOH among the first to nth states of health scores $SOH_1$, $SOH_2$, ..., $SOH_n$ may be stored over time in the storage unit 150. The first to nth states of health scores $SOH_1$, $SOH_2$, ..., $SOH_n$ may be stored as the state of health score SOH in the storage unit 150 in relation with a generated time t. For example, when the first state of health score $SOH_1[t1]$ is calculated at a first time t1, the nth state of health score $SOH_n[t2]$ is calculated at a second time t2, and the second state of health score $SOH_2[t3]$ is calculated at a third time t3, the state of health score $SOH[t1]=SOH_1[t1]$ of the first time t1, the state of health score $SOH[t2]=SOH_n[t2]$ of the second time t2, and the state of health score $SOH[t3]=SOH_2[t3]$ of the third time t3 may be stored in the storage unit 150. A preset number of state of health scores SOH may be stored in the storage unit 150.

The microprocessor 140 may determine whether a state of health checking condition is satisfied (S380). The state of health checking condition may be determined based on the period in which the state of health score SOH generated in Operations S370a to S370c every time period Δt is stored. For example, the state of health checking condition may indicate whether the state of health score has been saved during a recent first period. Here, the first period may be a certain period such as 1 week, 2 weeks, 3 weeks, 4 weeks, 8 weeks, 12 weeks, and 16 weeks. According to another example, the state of health checking condition may indicate whether the number of state of health scores SOH stored in the storage unit 150 is or more than the preset number.

When the state of health checking condition is satisfied, the microprocessor 140 may estimate the value of the state of health SOH(t) of the battery 110 based on the state of health score SOH stored in the storage unit 150. When the state of health checking condition is not satisfied, the microprocessor 140 may not estimate the value of the state of health and may proceed to Operation S330. According to an example, the value of the state of health SOH(t) may be calculated as an average of the state of health scores SOH stored in the storage unit 150. For example, the value of the state of health SOH(t) may be calculated as an average of a preset number of state of health scores SOH stored in the storage unit 150. According to another example, the value of the state of health SOH(t) may be calculated as an average of the state of health scores SOH stored during the first period in the storage unit 150.

According to another example, the microprocessor 140 may calculate moving averages or weighted moving averages of the state of health scores SOH stored in the storage unit 150 of the second period, and may estimate the value of the state of health SOH(t) based on the average of the calculated moving averages or the weighted moving averages. The value of the state of health SOH(t) may be calculated as the average of the moving averages or the weighted moving averages of the state of health scores SOH stored in the storage unit 150 of the second period. The second period may be identical to the first period, or may be shorter than the first period.

The result of dividing the charge/discharge rate section into three sections and performing the method of estimating the state of health of the battery of the present disclosure by will be explained with reference to FIGS. 5 to 8.

Figure 5:
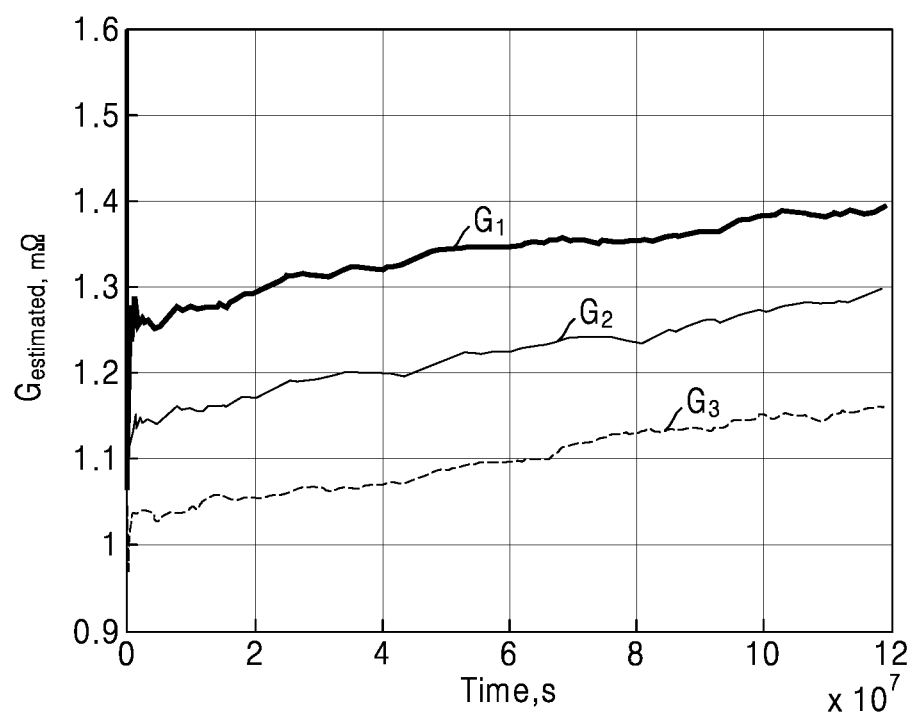
FIG. 5 is a graph illustrating values of first to third G parameters as a result of performing the method of estimating a state of health of a battery of the present disclosure.

FIG. 5 is a graph illustrating values of first to third G parameters as a result of performing the method of estimating a state of health of a battery of the present disclosure.

The result of FIG. 5 is a result of using the first to third charge/discharge rate sections of FIG. 4. Thus, in the method of FIG. 4, n was preset to 3. The first charge/discharge rate section was preset to be greater than or equal to 0.2 C and less than 0.3 C, and the second charge/discharge rate section was preset to be greater than or equal to 0.3 C and less than 0.5 C, and the third charge/discharge rate section was preset to be greater than or equal to 0.5 C and less than 1 C. The battery 100 had a capacity of 50 Ah, the first threshold value $th_1$ was 10 A, the second threshold value $th_2$ was 15 A, the third threshold value $th_3$ was 25 A, and the fourth threshold value $th_4$ was 50 A.

It can be seen that the first G parameter values, the second G parameter values, and the third G parameter values, which show a state amount indicating the sensitivity of a terminal voltage to a change in applied current of the battery, increase approximately linearly over time.

Figure 6:
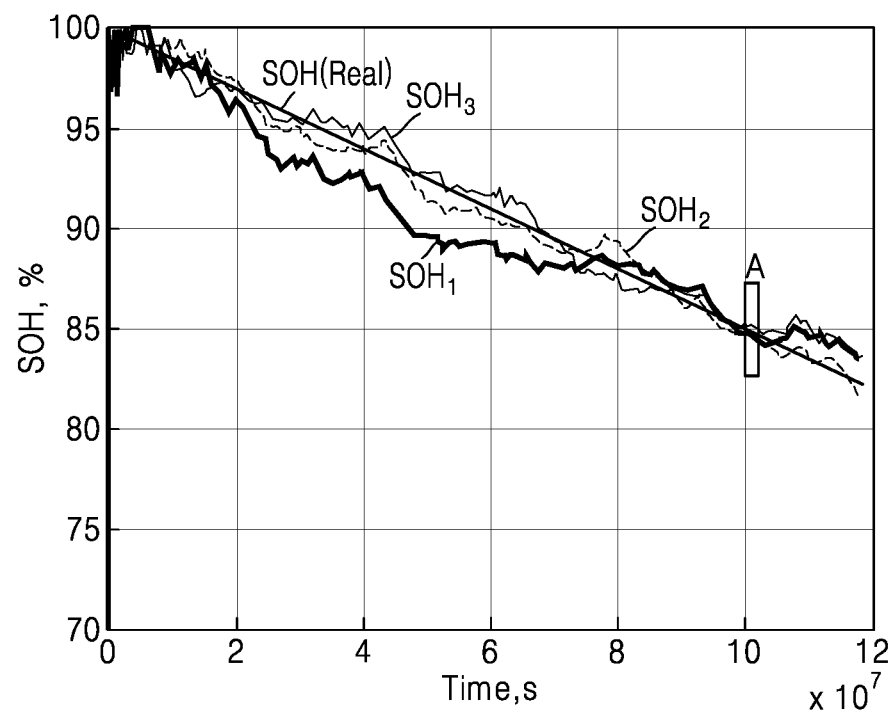
FIG. 6 is a graph illustrating the first to third states of health scores calculated based on the values of the first to third G parameters illustrated in FIG. 5.

FIG. 6 is a graph illustrating the first to third states of health scores calculated based on the values of the first to third G parameters illustrated in FIG. 5.

In the present example, the initial value $G_1^i$ and the final value $G_1^f$ of the first G parameter were set to 1.26 mΩ and 2.06 mΩ, respectively, the initial value $G_2^i$ and the final value $G_2^f$ of the second G parameter were set to 1.15 mΩ and 1.95 mΩ, respectively, and the initial value $G_3^i$ and the final value $G_3^f$ of the third G parameter were set to 1.03 mΩ and 1.83 mΩ, respectively.

As shown in FIG. 6, the first state of health score SOH$_1$, the second state of health score SOH$_2$, and the third state of health score SOH$_3$ decrease over time. FIG. 6 shows an actual value of the state of health SOH(Real). The errors calculated as the root mean square error (RMSE) between each of the first state of health score SOH$_1$, the second state of health score SOH$_2$, and the third state of health score SOH$_3$ and the actual value of the state of health SOH(Real) were equal to or less than 1.12%.

Figure 7:
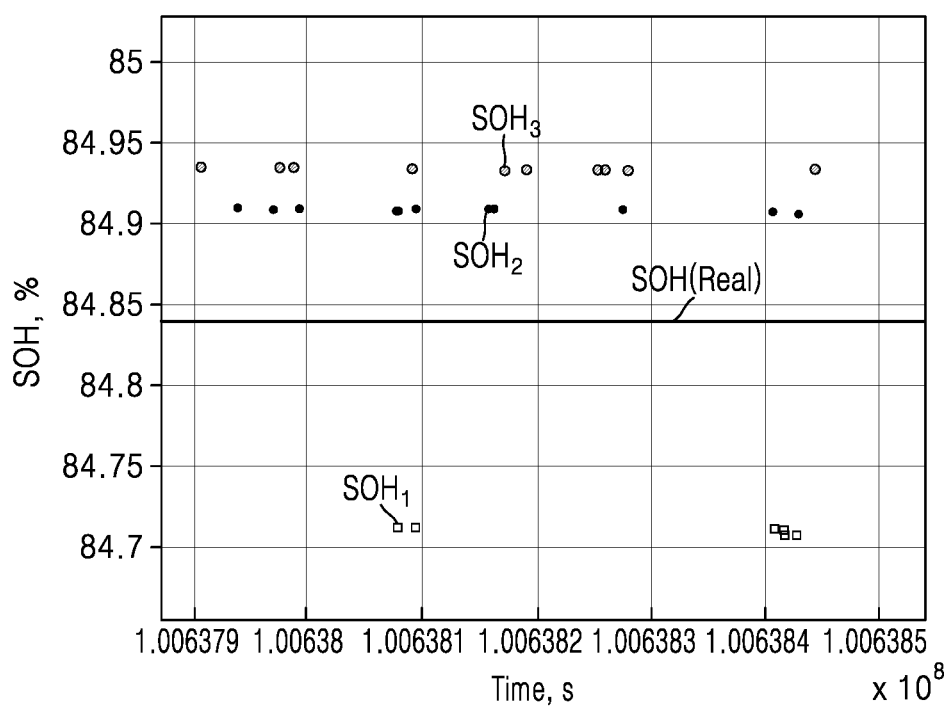
FIG. 7 is a graph wherein part A of FIG. 6 is enlarged.

FIG. 7 is a graph wherein part A of FIG. 6 is enlarged.

Referring to FIG. 7, it can be seen that the first state of health score SOH$_1$, the second state of health score SOH$_2$, and the third state of health score SOH$_3$ are generated over time. The first state of health score SOH$_1$, the second state of health score SOH$_2$, and the third state of health score SOH$_3$ may not always be generated, and when the current difference ΔI, which is a difference between the present current value I(t) and the preceding current value I(t−1), belongs to the first charge/discharge rate section, the first state of health score SOH$_1$ may be generated, when the current difference ΔI belongs to the second charge/discharge rate section, the second state of health score SOH$_2$ may be generated, when the current difference ΔI belongs to the third charge/discharge rate section, the third state of health score SOH$_3$ may be generated, and when the current difference ΔI does not belong to any charge/discharge rate section, none of the first to third states of health scores SOH$_1$, SOH$_2$, SOH$_3$ may be generated. That is, when the current value I(t) is constant or suddenly changed, the state of health score may not be generated.

Figure 8:
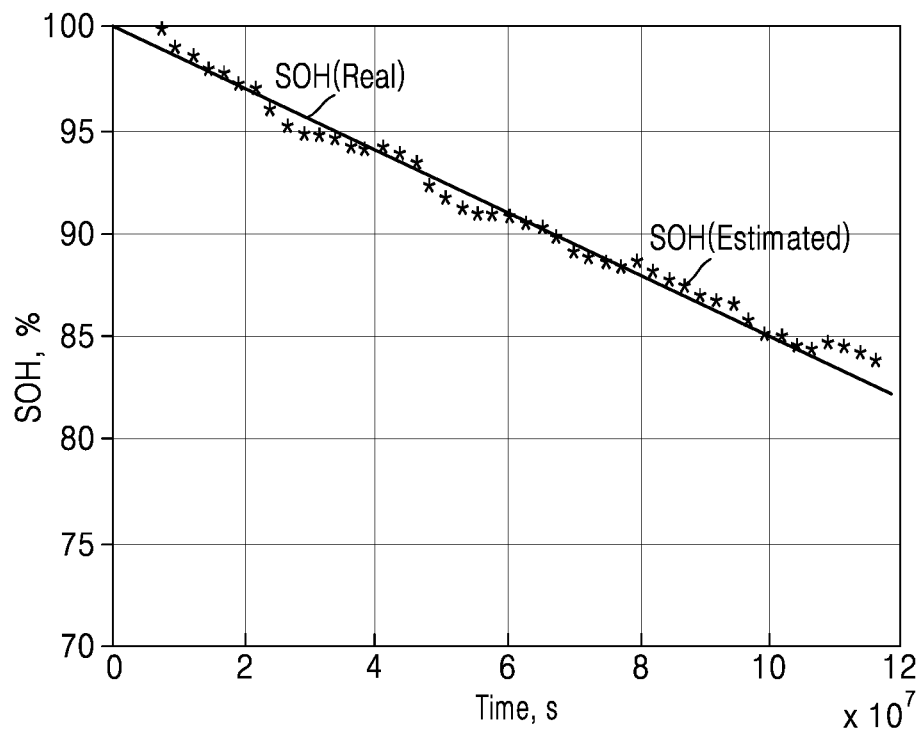
FIG. 8 is a graph illustrating a value of a state of health estimated based on the first to third states of health scores of FIG. 6.

FIG. 8 is a graph illustrating a value of a state of health estimated based on the first to third states of health scores of FIG. 6.

In the present example, the estimated value of the state of health SOH(Estimated) according to the present disclosure was calculated as the average of the 4-week moving average of the first state of health score SOH$_1$, the 4-week moving average of the second state of health score SOH$_2$, and the 4-week moving average of the third state of health score SOH$_3$. The error calculated as the root mean square error (RMSE) between the calculated value of the state of health SOH(Estimated) and the actual value of the state of health SOH(Real) was 0.59%. The error decreased by about 50%.

The spirit of the present disclosure is not limited to the above-described embodiments, and all ranges equivalent to the claims or equivalently changed therefrom as well as the claims described below belong to the scope of the spirit of the present disclosure.

The invention claimed is:

1. A method of estimating a state of health of a battery, the method comprising:
   measuring, by a voltage measurement unit, a voltage of the battery in use to periodically generate a voltage value and measuring, by a current measurement unit, a current of the battery to periodically generate a current value by:
      generating an immediately preceding voltage value and an immediately preceding current value; and
      generating a present voltage value and a present current value after a preset time period;
   using an adaptive filter to periodically update a value of a G parameter and a value of an H parameter in real time from the voltage value and the current value, said parameters indicating a present state of the battery, the adaptive filter being a filter using a recursive least squares (RLS) method;
   using an initial value and a final value of the G parameter that are preset values and a present value of the G parameter to estimate the state of health of the battery in real time;
   initializing a state vector composed of the G parameter and the H parameter, and a covariance matrix;
   setting the initial value and the final value of the G parameter;
   calculating a current difference between the present current value and the immediately preceding current value; and
   comparing the current difference with a preset range,
   wherein, when the current difference is within the preset range, the values of the G parameter and the H parameter are updated using the present voltage value and the present current value,
   wherein, when the current difference exceeds the preset range, the values of the G parameter and the H parameter are not updated, and
   wherein the G parameter is a parameter that represents sensitivity of the voltage to changes in the current of the battery, and the H parameter is a parameter that represents an effective potential determined by local equilibrium potential distribution and resistance distribution inside the battery.

2. The method of claim 1, wherein the state of health of the battery is estimated based on a percentage value of the difference between the final value of the G parameter and the initial value of the G parameter relative to the difference between the final value of the G parameter and the present value of the G parameter.

3. A method of estimating a state of health of a battery, the method comprising:
   measuring, by a voltage measurement unit, a voltage of the battery in use to periodically generate a voltage value and measuring, by a current measurement unit, a current of the battery to periodically generate a current value by;
      generating an immediately preceding voltage value and an immediately preceding current value; and
      generating a present voltage value and a present current value after a preset time period;
   using an adaptive filter to periodically update a value of a G parameter and a value of an H parameter in real time from the voltage value and the current value, said parameters indicating a present state of the battery, the adaptive filter being a filter using a recursive least squares (RLS) method;
   using an initial value and a final value of the G parameter that are preset values and a present value of the G parameter to estimate the state of health of the battery in real time;
   initializing a state vector composed of the G parameter and the H parameter, and a covariance matrix; and
   setting the initial value and the final value of the G parameter,
   wherein the G parameter is a parameter that represents sensitivity of the voltage to changes in the current of the battery, and the H parameter is a parameter that represents an effective potential determined by local equilibrium potential distribution and resistance distribution inside the battery, and
   wherein the updating of the values of the G parameter and the H parameter in real time comprises:
      calculating a present voltage estimate of the battery based on the present current value and an immediately preceding value of the state vector;

updating a gain matrix and the covariance matrix based on the present current value and an immediately preceding value of the covariance matrix;

calculating a voltage error between the present voltage value and the present voltage estimate; and updating the state vector based on the immediately preceding value of the state vector, a present value of the gain matrix, and the voltage error so as to generate a present value of the G parameter and a present value of the H parameter.

4. The method of claim 3, wherein the present voltage estimate is calculated as a value obtained by adding an immediately preceding value of the H parameter to a product of the present current value and an immediately preceding value of the G parameter.

5. The method of claim 3, wherein a present value of the state vector is calculated as a value obtained by adding a product of the present value of the gain matrix and the voltage error to the immediately preceding value of the state vector.

6. The method of claim 3, wherein, in a case where the gain matrix and the covariance matrix are updated, a first forgetting factor relating to the G parameter and a second forgetting factor relating to the H parameter are applied.

7. The method of claim 6, wherein
the gain matrix is calculated by the following equation, and $$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$

the covariance matrix is calculated by the following equation, $$P(t) = \begin{bmatrix} P_1(t) \\ P_2(t) \end{bmatrix} = \begin{bmatrix} \{1 - L_1(t)I(t)\}P_1(t-1)/\lambda_1 \\ \{1 - L_2(t)\}P_2(t-1)/\lambda_2 \end{bmatrix}$$

wherein L(t) is a present value of the gain matrix, L(t−1) is an immediately preceding value of the gain matrix, P(t) is a present value of the covariance matrix, P(t−1) is an immediately preceding value of the covariance matrix, I(t) is the present current value, $\lambda_1$ is the first forgetting factor, and $\lambda_2$ is the second forgetting factor.

8. The method of claim 3, wherein the estimating the state of health of the battery in real time comprises:

storing a state of health score of the battery calculated based on the initial value, the final value, and the present value of the G parameter;

examining the state of health checking condition; and estimating a value of the state of health of the battery based on the state of health score.

9. The method of claim 8, wherein
the state of health checking condition is set based on whether the state of health score has been saved during a recent first period, and the value of the state of health of the battery is generated based on a moving average of the state of health scores of a second period.

10. A method of estimating a state of health of a battery, the method comprising:

measuring, by a voltage measurement unit, a voltage of the battery in use to periodically generate a voltage value and measuring, by a current measurement unit, a current of the battery to periodically generate a current value;

using an adaptive filter to periodically update a value of a G parameter and a value of an H parameter in real time from the voltage value and the current value, said parameters indicating a present state of the battery, the adaptive filter being a filter using a recursive least squares (RLS) method;

using an initial value and a final value of the G parameter that are preset values and a present value of the G parameter to estimate the state of health of the battery in real time;

setting first to nth charge/discharge rate sections (n is a natural number) that do not overlap with each other;

initializing first to nth state vectors including first to nth G parameters and first to nth H parameters, respectively, and first to nth covariance matrices;

setting initial values and final values of each of the first to nth G parameters;

generating an immediately preceding voltage value and an immediately preceding current value, and generating a present voltage value and a present current value after a preset time period;

calculating a current difference between the present current value and the immediately preceding current value;

comparing the current difference with each of the first to nth charge/discharge rate sections;

calculating each of first to nth states of health scores based on initial values, final values, and present values of each of the first to nth G parameters; and estimating a value of the state of health of the battery in real time based on the first to nth states of health scores, wherein the G parameter is a parameter that represents sensitivity of the voltage to changes in the current of the battery, and the H parameter is a parameter that represents an effective potential determined by local equilibrium potential distribution and resistance distribution inside the battery.

11. The method of claim 10, wherein, when the current difference belongs to a jth section among the first to nth charge/discharge rate sections (j is a natural number less than or equal to n), a jth value of the G parameter and a jth value of the H parameter are updated using the present voltage value and the present current value, and a jth state of health score of the battery is calculated using an initial value, final value, and present value of the jth value of G parameter.

12. The method of claim 11, wherein the jth value of the G parameter and the jth value of the H parameter are updated in real time by:

calculating a present voltage estimate of the battery based on the present current value and an immediately preceding value of a jth state vector;

updating a gain matrix and a jth covariance matrix based on the present current value and an immediately preceding value of the jth covariance matrix;

calculating a voltage error between the present voltage value and the present voltage estimate; and updating the jth state vector based on the immediately preceding value of the jth state vector, a present value of the gain matrix, and the voltage error.

13. A method of estimating a state of health of a battery, the method comprising:

initializing first to third state vectors and first to third covariance matrices used in a recursive least squares filter, wherein each of the first to third state vectors comprises first to third G parameters and first to third H parameters;

setting an initial value and a final value of the first G parameter, an initial value and a final value of the second G parameter, and an initial value and a final value of the third G parameter;

as an operation of periodically measuring a voltage and current of the battery in use, by respective ones of a voltage measurement unit and a current measurement unit, generating an immediately preceding voltage value and an immediately preceding current value, and after a preset time period, generating a present voltage value and a present current value;

calculating a current difference between the present current value and the immediately preceding current value;

updating the first state vector and a first covariance matrix when the current difference is greater than or equal to a first threshold value and less than a second threshold value, updating the second state vector and a second covariance matrix when the current difference is greater than or equal to the second threshold value and less than a third threshold value, and updating the third state vector and a third covariance matrix when the third covariance matrix is greater than or equal to the third threshold value and less than a fourth threshold value;

calculating a first state of health score based on the initial value, the final value, and a present value of the first G parameter, calculating a second state of health score based on the initial value, the final value, and a present value of the second G parameter, and calculating a third state of health score based on the initial value, the final value, and a present value of the third G parameter; and estimating a state of health of the battery in real time based on the first to third states of health scores.

14. The method of claim 13, further comprising examining a state of health checking condition based on whether the first to third states of health scores have been stored for a recent first period.

15. The method of claim 14, wherein the estimating the state of health of the battery in real time comprises:
calculating a first moving average of the first state of health scores of a second period;
calculating a second moving average of the second state of health scores of the second period;
calculating a third moving average of the third state of health scores of the second period; and
calculating a value of the state of health of the battery based on an average of the first to third moving averages.

16. The method of claim 13, wherein the updating a kth state vector and a kth covariance matrix (k is 1, 2, or 3) comprises:
calculating a present voltage estimate of the battery based on the present current value and a recent value of the kth state vector;
updating a gain matrix and the kth covariance matrix based on the present current value and a recent value of the kth covariance matrix;
calculating a voltage error between the present voltage value and the present voltage estimate; and
updating the kth state vector based on a recent value of the kth state vector, a present value of the gain matrix, and the voltage error.

17. The method of claim 16, wherein, in a case where the gain matrix and the kth covariance matrix are updated, a first forgetting factor relating to a kth G parameter and a second forgetting factor relating to a kth H parameter are applied.

* * * * *

UNITED STATES PATENT AND TRADEMARK OFFICE
CERTIFICATE OF CORRECTION

PATENT NO. : 12,050,251 B2
APPLICATION NO. : 17/310954
DATED : July 30, 2024
INVENTOR(S) : Byeonghui Lim et al.

It is certified that error appears in the above-identified patent and that said Letters Patent is hereby corrected as shown below:

In the Specification

In Column 15, Lines 10-11, delete

" $$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda \\ P_2(t-1)/\lambda_2 \end{bmatrix}$$ ," and insert -- $$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$ --.

In the Claims

In Column 27, Claim 7, Lines 30-33, delete

" $$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda \\ P_2(t-1)/\lambda_2 \end{bmatrix}$$ ," and insert -- $$L(t) = \begin{bmatrix} L_1(t) \\ L_2(t) \end{bmatrix} = \frac{1}{1 + P_1(t-1)I(t)^2/\lambda_1 + P_2(t-1)/\lambda_2} \begin{bmatrix} P_1(t-1)I(t)/\lambda_1 \\ P_2(t-1)/\lambda_2 \end{bmatrix}$$ --.

Signed and Sealed this
Third Day of December, 2024

*Katherine Kelly Vidal*
Katherine Kelly Vidal
*Director of the United States Patent and Trademark Office*